US006841806B1

(12) United States Patent
Taylor et al.

(10) Patent No.: US 6,841,806 B1
(45) Date of Patent: Jan. 11, 2005

(54) HETEROJUNCTION THYRISTOR-BASED AMPLIFIER

(75) Inventors: Geoff W. Taylor, Storrs-Mansfield, CT (US); Jianhong Cai, Nashua, NH (US)

(73) Assignees: The University of Connecticut, Farmington, CT (US); Opel, Inc., West Warwick, RI (US)

(*) Notice: Subject to any disclaimer, the term of this patent is extended or adjusted under 35 U.S.C. 154(b) by 0 days.

(21) Appl. No.: 10/602,218

(22) Filed: Jun. 24, 2003

(51) Int. Cl.$^7$ .......................................... H01L 31/0328
(52) U.S. Cl. ...................... 257/183; 257/197; 257/200
(58) Field of Search ............................... 257/183, 197, 257/200, 198, 94, 103

(56) References Cited

U.S. PATENT DOCUMENTS

| | | | |
|---|---|---|---|
| 3,919,656 A | 11/1975 | Sokal et al. | 330/51 |
| 4,424,525 A | 1/1984 | Mimura | 357/23 |
| 4,658,403 A | 4/1987 | Takiguchi et al. | 372/96 |
| 4,683,484 A | 7/1987 | Derkits, Jr. | 357/16 |
| 4,806,997 A | 2/1989 | Simmons et al. | 357/16 |
| 4,814,774 A | 3/1989 | Herczfeld | 342/372 |
| 4,827,320 A | 5/1989 | Morkoc et al. | 357/22 |
| 4,829,272 A | 5/1989 | Kameya | 333/139 |
| 4,899,200 A | 2/1990 | Shur et al. | 357/30 |
| 4,949,350 A | 8/1990 | Jewell et al. | 372/45 |
| 5,010,374 A | 4/1991 | Cooke et al. | 357/16 |
| 5,105,248 A | 4/1992 | Burke et al. | 357/24 |
| 5,150,185 A * | 9/1992 | Yamada | 257/197 |
| 5,202,896 A | 4/1993 | Taylor | 372/50 |
| 5,337,328 A | 8/1994 | Lang et al. | 372/45 |
| 5,386,128 A | 1/1995 | Fossum et al. | 257/183.1 |
| 5,422,501 A | 6/1995 | Bayraktaroglu | 257/195 |
| 5,436,759 A | 7/1995 | Dijaili et al. | 359/333 |
| 5,698,900 A | 12/1997 | Bozada et al. | 257/744 |
| 5,739,554 A * | 4/1998 | Edmond et al. | 257/103 |
| 6,031,243 A | 2/2000 | Taylor | 257/13 |
| 6,043,519 A | 3/2000 | Shealy et al. | 257/195 |
| 6,320,212 B1 * | 11/2001 | Chow | 257/197 |
| 6,362,065 B1 * | 3/2002 | Swanson et al. | 438/344 |
| 2002/0067877 A1 | 6/2002 | Braun et al. | |

OTHER PUBLICATIONS

*10–Gb/s High–Speed Monolithically Integrated Photoreceiver Using InGaAs p–I–n PD and Planar Doped InAlAs/InGaAs HEMT's* by Y. Akahori et al., IEEE Photonics Technology Letters, vol. 4, No. 7, Jul. 1992.

(List continued on next page.)

*Primary Examiner*—Long Pham
*Assistant Examiner*—(Vikki) Hoa B. Trinh
(74) *Attorney, Agent, or Firm*—Gordon & Jacobson, PC

(57) ABSTRACT

An integrated circuit includes a heterojunction thyristor device having an anode terminal, a cathode terminal, a first injector terminal operably coupled to a first quantum well channel disposed between the anode terminal and the cathode terminal, and a second injector terminal operably coupled to a second quantum well channel disposed between the anode terminal and the cathode terminal. Bias elements operate the heterojunction thyristor device in a mode that provides substantially linear voltage gain for electrical signals supplied to at least one of the first and second injector terminals for output to at least one output node. Preferably, the bias elements include a first DC current source operably coupled to an n-type modulation doped quantum well structure, a second DC current source operably coupled to a p-type modulation doped quantum well structure, a first bias resistance operably coupled between a high voltage supply and the anode terminal, and a second bias resistance operably coupled between the cathode terminal and a low voltage supply. The bias elements provide a current passing from the anode terminal to the cathode terminal that is below a characteristic hold current for the heterojunction thyristor device to thereby inhibit switching of the heterojunction thyristor device. The DC current provided by the DC current sources controls the amount of voltage gain provided by the heterojunction thyristor device.

23 Claims, 14 Drawing Sheets

OTHER PUBLICATIONS

*10–Gbit/s InP–Based High–Performance Monolithic Photoreceivers Consisting of p–i–n Photodiodes and HEMT's* by Kiyoto Takahata et al., IEICE TRANS. ELECTRON., vol. E83–C, No. 6, Jun. 2000.

*10 Ghz Bandwidth Monolithic p–i–n Modulation–Doped Field Effect Transistor Photoreceiver* by N.K. Dutta et al., Appl. Phys. Lett., vol. 63, No. 15, Oct. 11, 1993.

*20 Gbit/s Long Wavelength Monolithic Integrated Photoreceiver Grown on GaAs* by V. Hurm et al., Electronic Letters, vol. 33, No. 7, Mar. 27, 1997.

*Heterojunction Field–Effect Transistor (HFET)* by G.W. Taylor et al., Electronics Letters, vol. 22, No. 15, pp. 784–786, Jul. 17, 1986.

*High Temperature Annealing of Modulation Doped GaAs/ AlGaAs Heterostructures for FET Applications* by H. Lee et al., 1983 IEEE/Cornell Conf. On High–Speed Semiconductor Devices & Ckts, 8/83.

*Monolithic Integrated Optoelectronic Circuits* by M. Berroth et al., 0–7803–2442–0–8/95 IEEE, 1995.

*Physical Layer Solution for Very Short Reach Applications Utilizing Parallel Optics* by Steve Ahart, Agilent Technologies, ONIDS 2002.

*Parallel Optics: the Solution for High–Speed Interconnects* downloaded from www.paralleloptics.org, Dec. 2000, updated Apr., May, Jul., Sept., Nov. 2001 and Jan., Apr. and Jul. 2002.

*Submicrometre Gate Length Scaling of Inversion Channel Heterojunction Field Effect Transistor* by P.A. Kiely et al., Electronics Letters, vol. 30, No. 6, Mar. 17, 1994.

*Theorectical and Experimental Results for the Inversion Channel Heterostructure Field Effect Transistor* by G.W. Taylor et al., IEE Proceedings–G, vol. 140, No. 6, Dec. 1993.

* cited by examiner

| Layer Material | Layer Dopant Type | Typical Doping (atoms/cm³) | Typical Layer Thickness (Å) | Layer # |
|---|---|---|---|---|
| InGaAs | P+ | 1E20 | 25 | 165b |
| GaAs | P+ | 1E20 | 75 | 165a |
| Al(.7)Ga(.3)As | P | 1E17 | 700 | 164b |
| Al(.7)Ga(.3)As | P+ | 1E19 | 10 | 164a |
| Al(.15)Ga(.85)As | P+ | 3.5E11 | 25 | 163d |
| Al(.15)Ga(.85)As |  | UD | 300 | 163c |
| Al(.15)Ga(.85)As |  | 3.5E11 | 80 | 163b |
| Al(.15)Ga(.85)As |  | UD | 30 | 163a |
| GaAs |  | UD | 15 | 162 |
| In(.20)Ga(.80)AsN QW/ GaAs QW } x 3 | N+ | UD | 60 | 161 |
| GaAs Barrier |  |  |  |  |
| GaAs |  | UD | 100 | 160b |
| Al(.15)Ga(.85)As |  | UD | 150 | 160a |
| GaAs Barrier |  | UD | 5000 | 159 |
| In(.20)Ga(.80)AsN QW/ GaAs QW } x 3 |  | UD | 100 | 158 |
| GaAs |  | UD | 60 | 157 |
| Al(.15)Ga(.85)As |  | UD | 15 | 156 |
| Al(.15)Ga(.85)As | P+ | UD | 30 | 155d |
| Al(.15)Ga(.85)As |  | 3.5E18 | 80 | 155c |
| Al(.15)Ga(.85)As |  | 3.5E18 | 300 | 155b |
| Al(.15)Ga(.85)As | N+ | 3.5E18 | 80 | 155a |
| Al(.7)Ga(.3)As | N | 1E17 | 700 | 154 |
| GaAs | N+ | 3.5E18 | 2200 | 153 |
| AlAs |  | UD | 1701 | 151 |
| GaAs } x 7 |  | UD | 696 | 152 |
| AlAs |  | UD | 1701 | 151 |
| GaAs Substrate |  | SI |  | 149 |

FIG. 1B

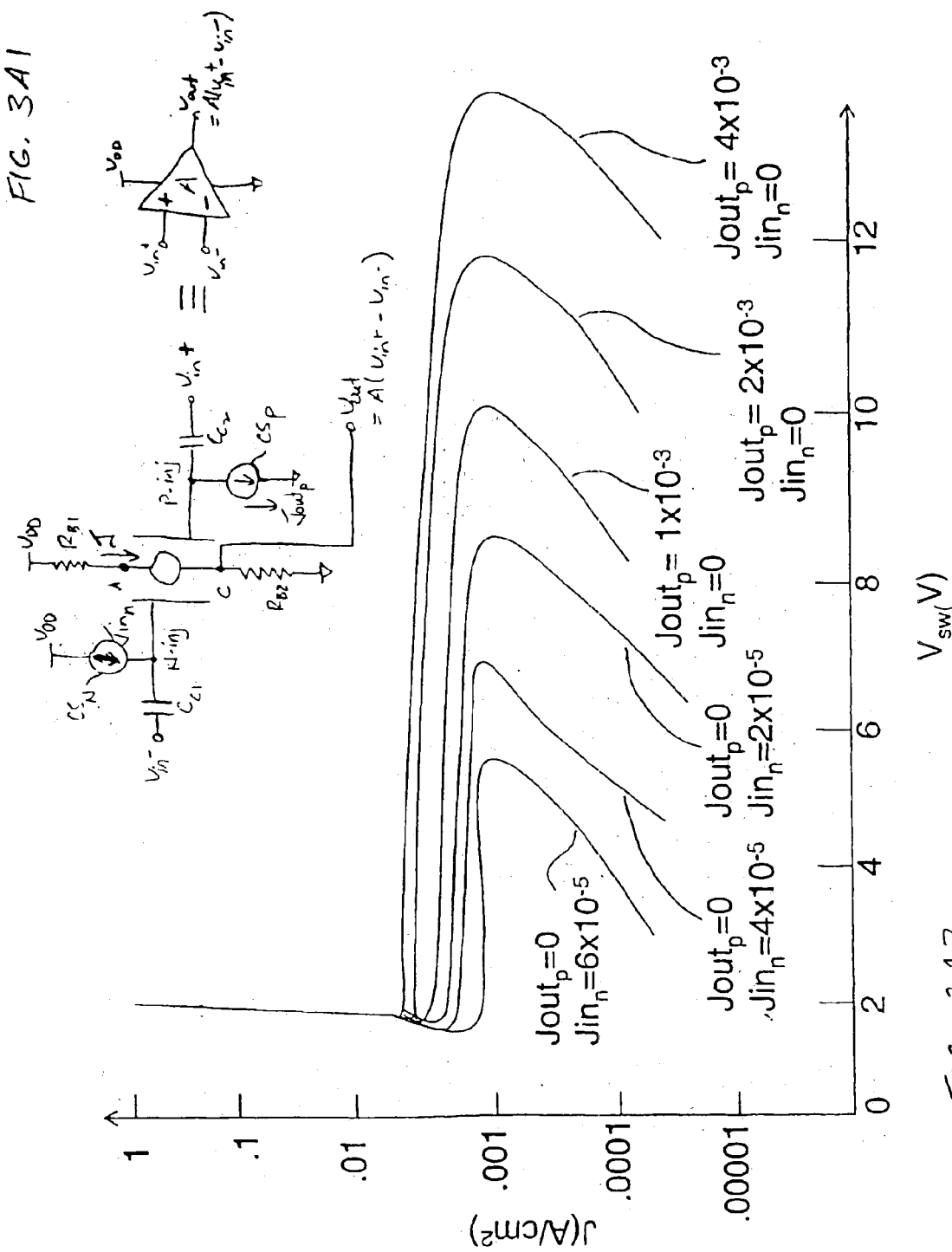

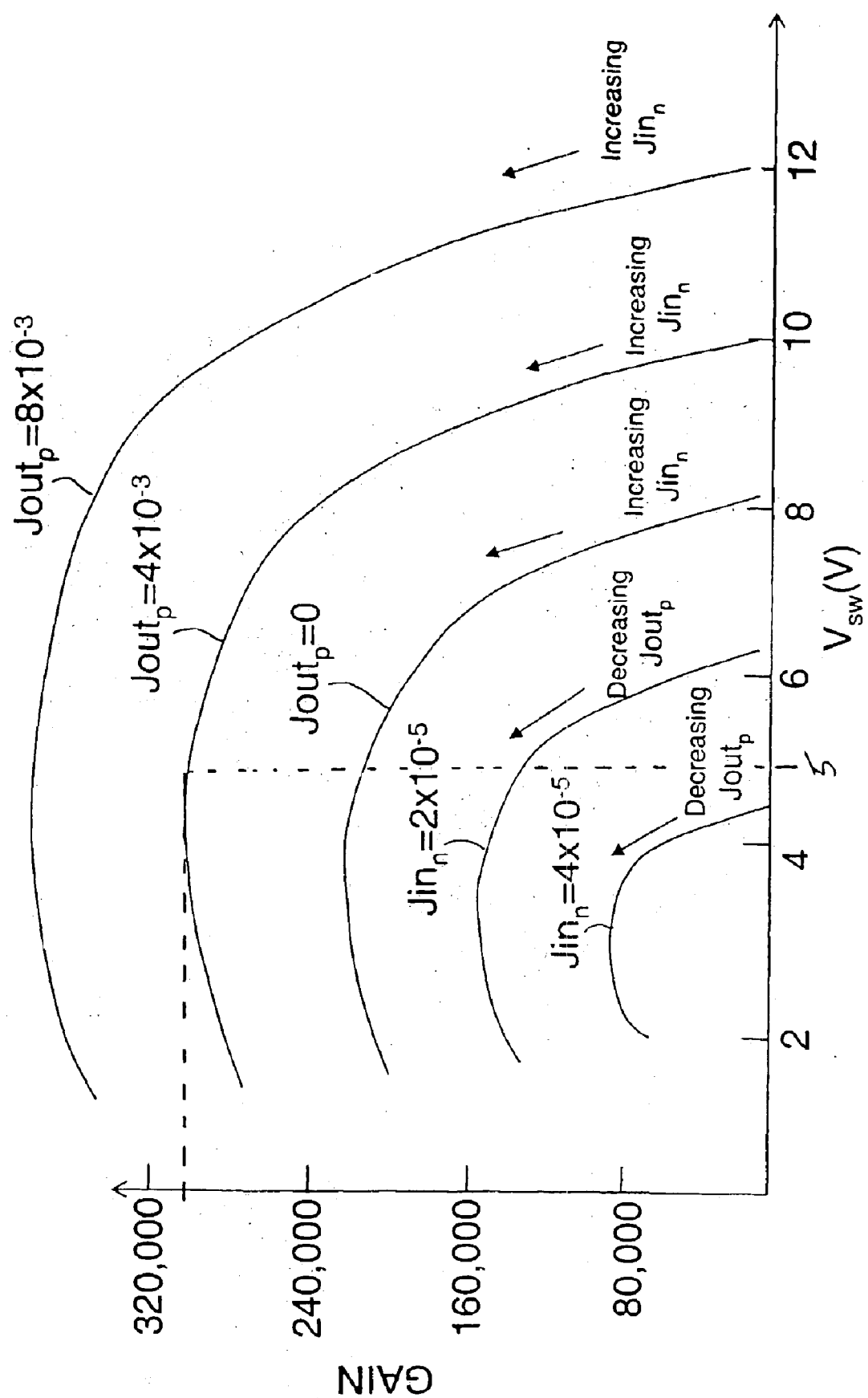
FIG. 3A3

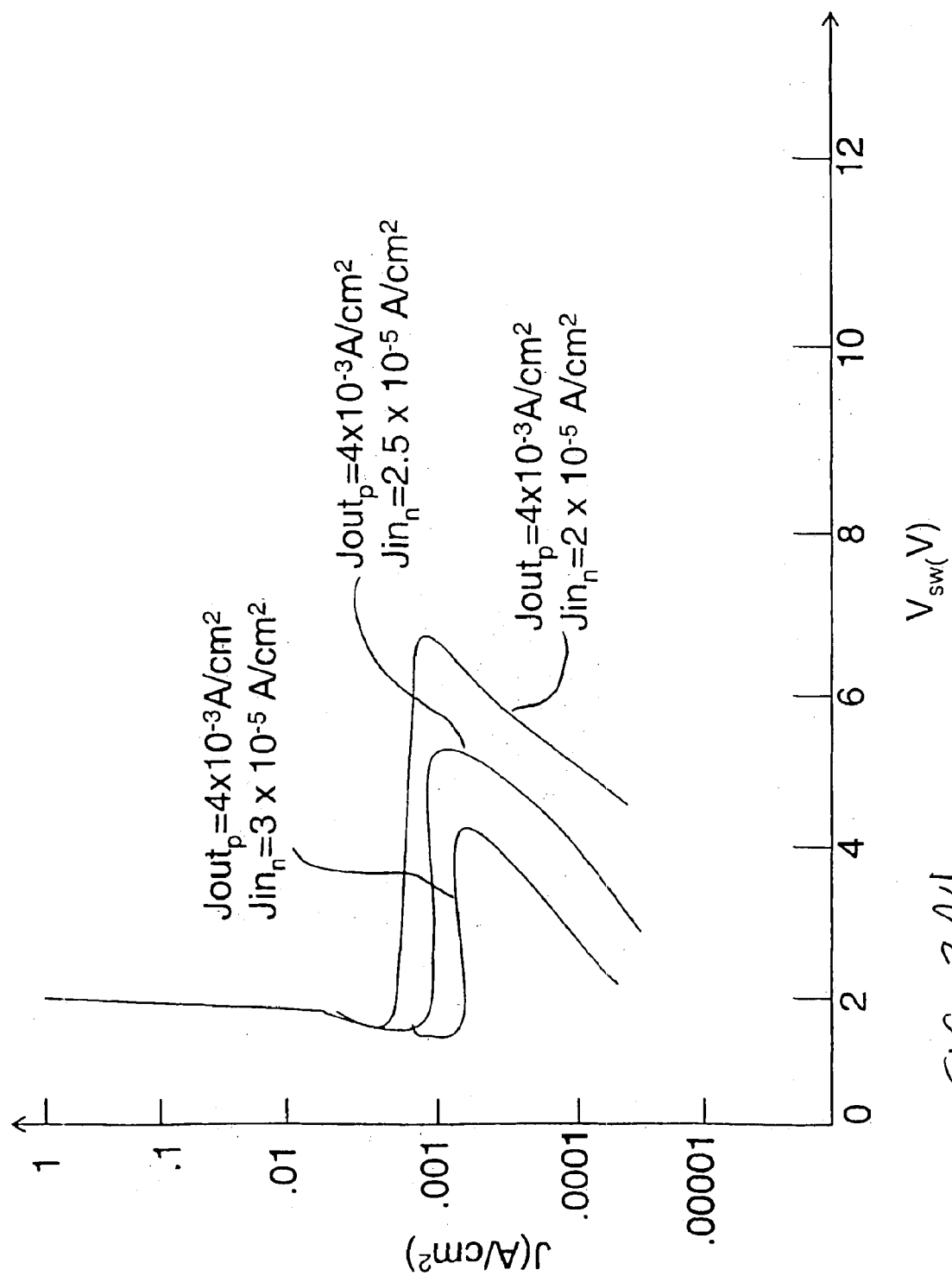
FIG. 3A4

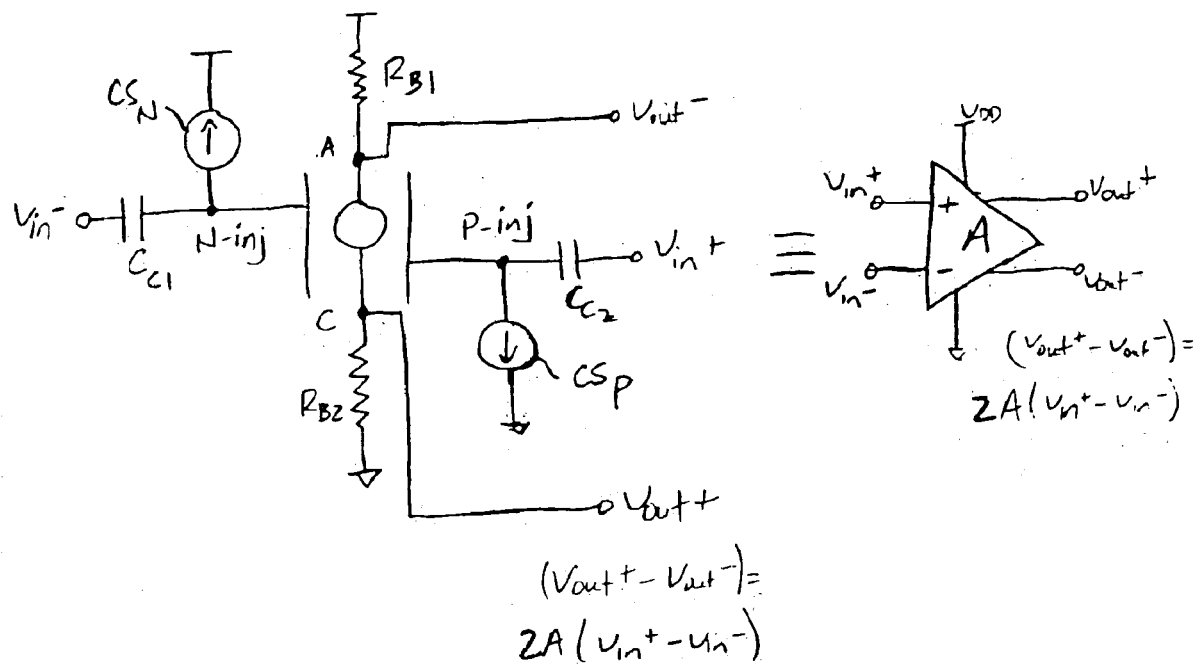
FIG. 3A5

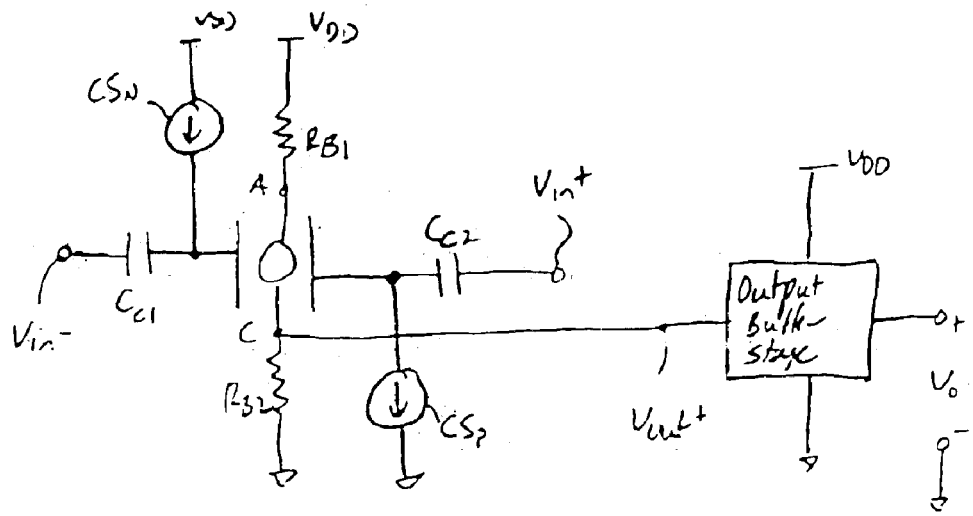
FIG. 3A6    where $V_o \approx -A(V_{in}{+} - V_{in}{-})$
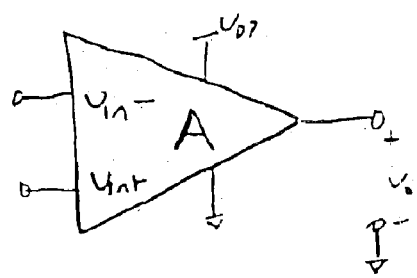
where $V_o \approx -A(V_{in}{+} - V_{in}{-})$
FIG. 3A7

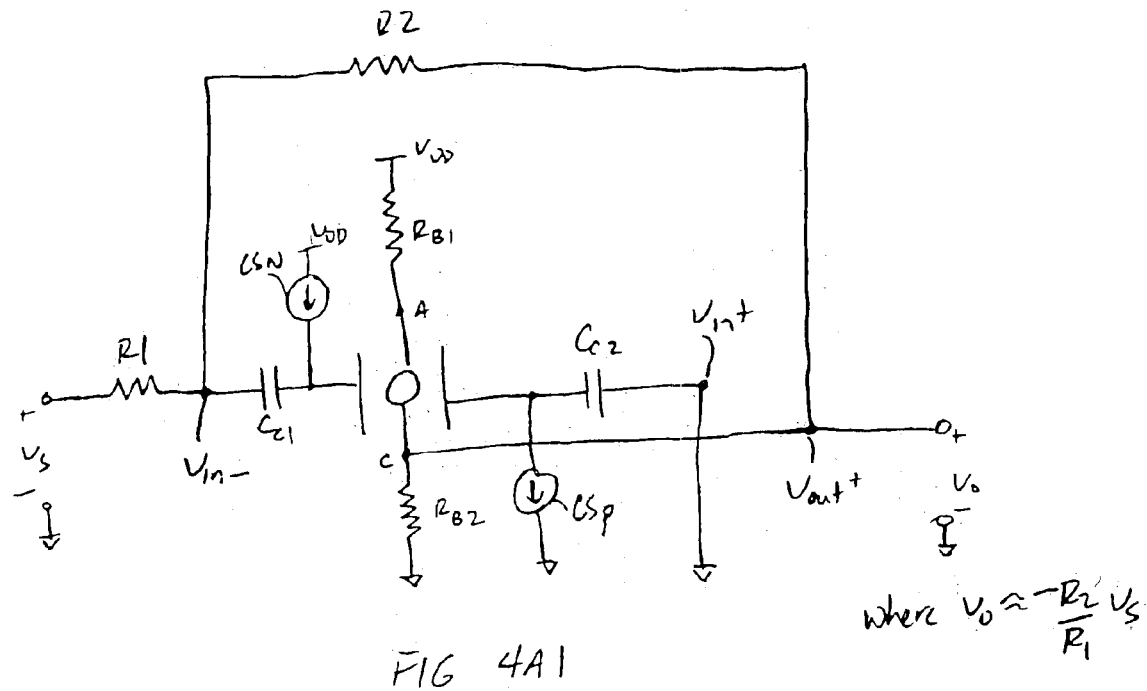
FIG 4A1
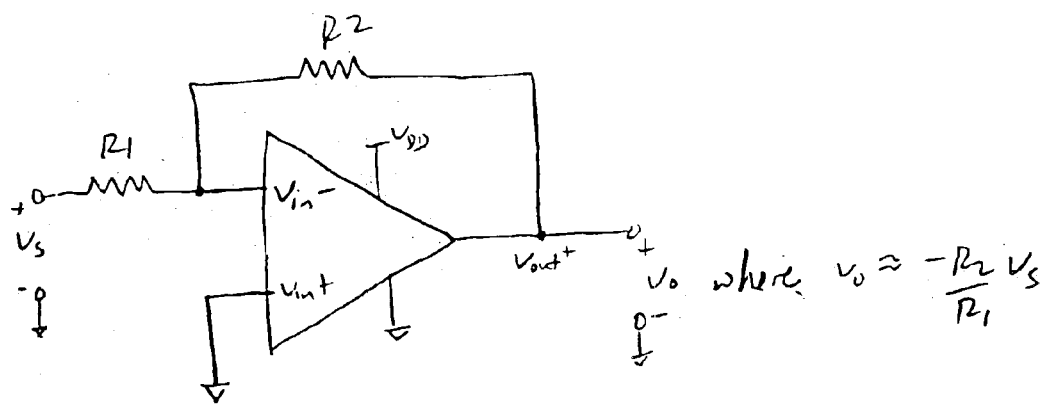
FIG. 4A2

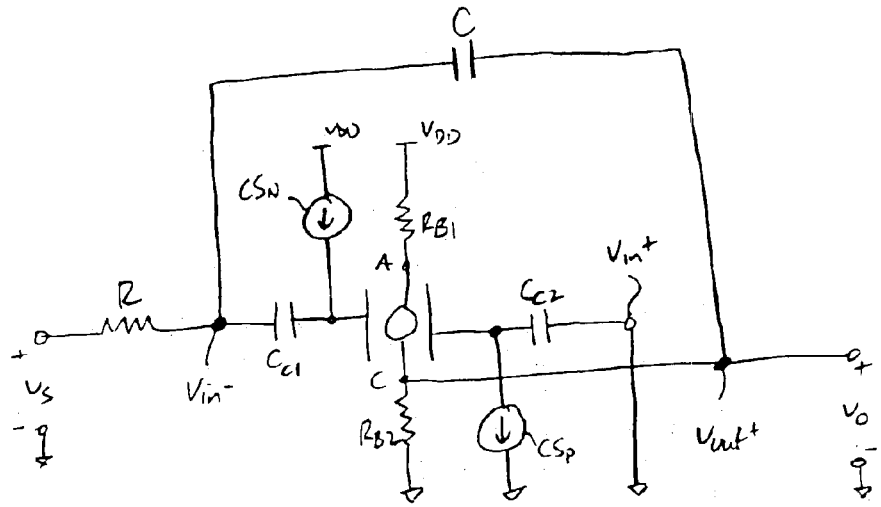
where $v_o(t) \approx \frac{-1}{RC} \int v_s(t) dt$
FIG. 4B1
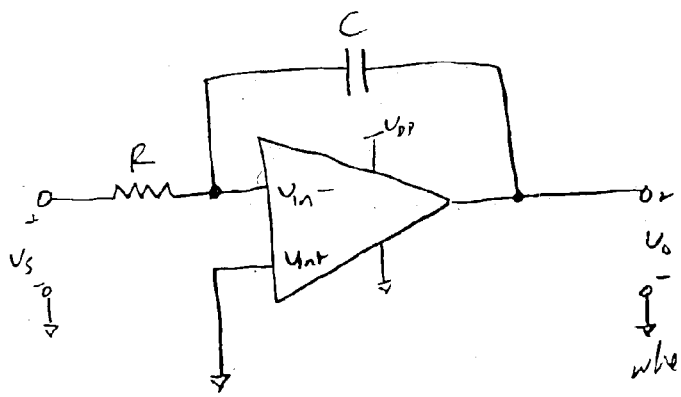
FIG. 4B2
where
$v_o(t) \approx \frac{-1}{RC} \int v_s(t) dt$

HETEROJUNCTION THYRISTOR-BASED AMPLIFIER

BACKGROUND OF THE INVENTION

1. Field of the Invention

This invention relates broadly to semiconductor devices and signal processing circuits realized from such semiconductor devices. More particularly, this invention relates to semiconductor devices that provide high gain signal amplification for use as a building block in a variety of signal processing applications.

2. State of the Art

Operational amplifier circuits and other high gain amplifier circuits are typically realized by a multistage design. For example, several well known operational amplifier designs utilize a differential amplifier stage, a high gain stage, and an output buffer stage. The high gain stage may be a differential-input amplifier stage or a single-ended input amplifier stage. In these designs, the transistor count is typically on the order of thirty transistors. For high frequency applications, these designs may be realized with high-frequency transistors such as heterojunction bipolar transistors (HBTs) or pseudomorphic high electron mobility transistors (PHEMTs).

The large number of transistors and associated circuit elements that form an operational amplifier (or other high gain amplifier), encompass a relatively large area when such devices are realized as part of an integrated circuit and thus may be problematic when integrating the amplifier circuit as part of a monolithic integrated circuit. In addition, the large number of transistors and associated circuit elements consume power, which may be problematic in low-power applications, such as mobile battery-powered applications.

Thus, there remains a need in the art to provide an operational amplifier circuit/high gain amplifier circuit that has a small device count, thereby improving the integration capability of circuit as well as the power consumption of the circuit. In addition, there is a need for an operational amplifier circuit/high gain amplifier circuit that is suitable for monolithic integration with a broad range of electronic circuitry (such as FETs and bipolar type transistors, logic, etc), waveguides and other optoelectronic devices.

SUMMARY OF THE INVENTION

It is therefore an object of the invention to provide an operational amplifier circuit/high gain amplifier circuit that has a small device count, thereby improving the integration capability of circuit as well as the power consumption of the circuit.

It is another object of the invention to provide an operational amplifier circuit/high gain amplifier circuit that is formed from a multilayer growth structure that can also be used to build a broad range of devices such as optical emitters, optical detectors, optical modulators, optical amplifiers, transistors, and optical waveguide devices.

It is a further object of the invention to provide an operational amplifier circuit/high gain amplifier circuit utilizing a thyristor device formed from a multilayer growth structure that can also be used to build a broad range of devices such as optical emitters, optical detectors, optical modulators, optical amplifiers, transistors, and optical waveguide devices.

It is an additional object of the invention to provide an operational amplifier circuit/high gain amplifier circuit utilizing a device formed from a multilayer growth structure wherein the magnitude of the signal gain provided by the device is controllable over a range of gain values, preferably in the range greater than 200.

It will be appreciated that such operational amplifier/high gain amplifier circuits can be used as a building block in many diverse signal processing applications.

According to the present invention, an integrated circuit includes a heterojunction thyristor device having an anode terminal, a cathode terminal, a first injector terminal operably coupled to a first quantum well channel disposed between the anode terminal and the cathode terminal, and a second injector terminal operably coupled to a second quantum well channel disposed between the anode terminal and the cathode terminal. Bias elements operate the heterojunction thyristor device in a mode that provides substantially linear voltage gain for a range of electrical signals supplied to at least one of the first and second injector terminals for output to at least one output node. The open loop voltage gain provided by the heterojunction thyristor device may be large (for example, in the illustrative embodiment, the open loop voltage gain is at least 200, and more particularly greater than 10,0000). Preferably, the bias elements include a first DC current source operably coupled to an n-type modulation doped quantum well structure, a second DC current source operably coupled to a p-type modulation doped quantum well structure, a first bias resistor operably coupled between a high voltage supply and the anode terminal, and a second bias resistor operably coupled between the cathode terminal and a low voltage supply. The bias elements provide a current passing from the anode terminal to the cathode terminal that is below a characteristic hold current for the heterojunction thyristor device to thereby inhibit switching of the heterojunction thyristor device. The DC current provided by the DC current sources controls the amount of voltage gain provided by the heterojunction thyristor device.

According to one embodiment of the present invention, a differential input signal is supplied to the first and second injector terminals. In this configuration, the cathode terminal produces a single-ended output signal that represents the differential input signal amplified by a high inverted characteristic gain, and the anode terminal produces a single-ended output signal that represents the differential input signal amplified by a high non-inverted characteristic gain. The cathode terminal and anode terminal together produce a differential output signal that represents the differential input signal amplified by a high characteristic gain. The output of the device may be supplied by one of these signals as appropriate.

According to other embodiments of the present invention, monolithic integrated circuits that include a heterojunction thyristor-based amplifier device that is integrally formed from a multilayer structure with other optoelectronic devices (such as optical emitters, optical detectors, optical modulators, optical amplifiers), electronic devices (such as transistors) in addition to optical devices (such as waveguide devices).

Additional objects and advantages of the invention will become apparent to those skilled in the art upon reference to the detailed description taken in conjunction with the provided figures.

BRIEF DESCRIPTION OF THE DRAWINGS

FIG. 1B is a schematic showing an exemplary layer structure made with group III–V material in accordance with the present invention, and from which devices of the present invention can be made;

FIG. 3A1 is a pictorial illustration of an exemplary configuration of a heterojunction thyristor-based operational amplifier/high gain amplifier circuit in accordance with the present invention.

FIG. 3A2 is a graph showing the current-voltage characteristics of the thyristor device of FIG. 3A1.

FIG. 3A3 is a graph illustrating representative signal gain of the thyristor device of FIG. 3A1 over varying injector currents.

FIG. 3A4 is a graph showing the current-voltage characteristics of the thyristor device of FIG. 3A1 over varying injector currents that provide a switching voltage near 5 volts and a large inverting open-loop voltage gain (in this simulation, near 300,000).

FIG. 3A5 is a pictorial illustration of an exemplary configuration of the heterojunction thyristor device of FIG. 3A1 configured for differential output.

FIG. 3A6 is a pictorial illustration of another exemplary configuration of a thyristor-based operational amplifier/high gain amplifier circuit in accordance with the present invention.

FIG. 3A7 is an equivalent circuit representation of the thyristor-based operational amplifier/high gain amplifier circuit of FIG. 3A6.

FIG. 4A1 is a pictorial illustration of an exemplary configuration of the thyristor-based operational amplifier as an inverting amplifier in accordance with the present invention.

FIG. 4A2 is an equivalent circuit representation of the thyristor-based inverting amplifier circuit of FIG. 4A1.

FIG. 4B1 is a pictorial illustration of an exemplary configuration of the thyristor-based operational amplifier as an inverting amplifier in accordance with the present invention.

FIG. 4B2 is an equivalent circuit representation of the thyristor-based integrator circuit of FIG. 4B1.

DETAILED DESCRIPTION OF THE PREFERRED EMBODIMENTS

The present invention builds upon novel device structures utilizing modulation-doped quantum well (QW) heterojunctions that do not suffer from the problems associated with the prior art PHEMT devices and prior art HBT devices. Such novel device structures are described in detail in U.S. Pat. Nos. 6,031,243; 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238 filed on Apr. 26, 2002; U.S. patent application Ser. No. 10/280, 892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942 filed on Jan. 13, 2003; each of these references herein incorporated by reference in its entirety.

Figure 1A:
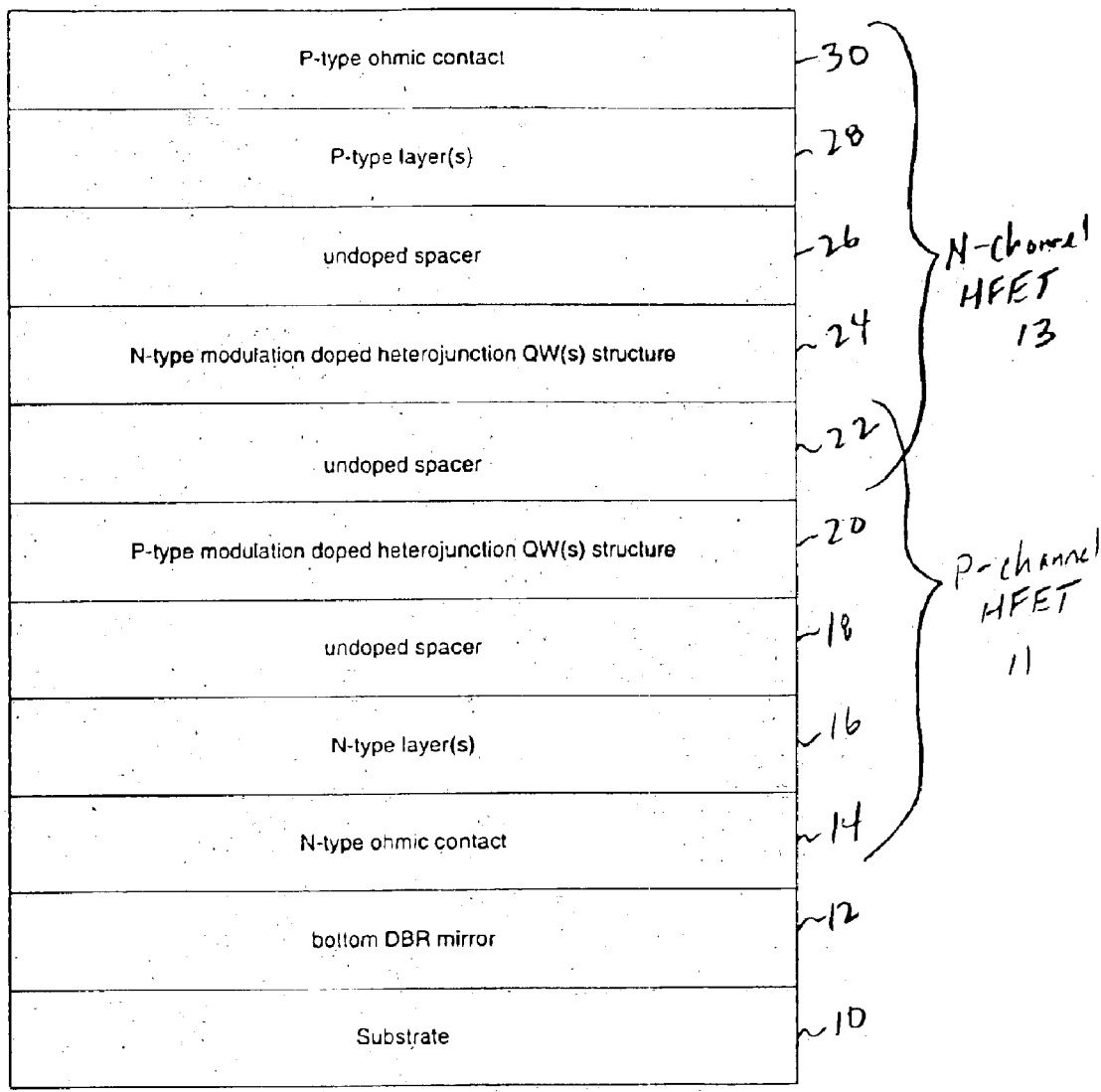
FIG. 1A is a cross-sectional schematic showing a layer structure in accordance with the present invention, and from which devices of the present invention can be made.

Turning now to FIG. 1A, a multi-layer sandwich structure in accordance with the present invention, and from which devices of the present invention can be made, includes a bottom dielectric distributed bragg reflector (DBR) mirror 12 formed on a substrate 10. The bottom DBR mirror 12 typically is formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4n$) optical thickness, the reflections from each of the boundaries will be added in phase to produce a large amount of reflected light (e.g., a large reflection coefficient) at the particular center wavelength $\lambda_D$. Deposited upon the bottom DBR mirror 12 is the active device structure which logically consists of two HFET devices. The first of these is a p-channel HFET device 11 (referred to herein as PHFET 11) comprising layers 14, 16, 18, 20 and 22. The PHFET device 11 which has one or more p-type modulation doped QW channels and is positioned with the gate terminal on the lower side (i.e. on the bottom DBR mirror 12) and the collector terminal on the upper side. The second of these is an n-channel HFET device 13 (referred to herein as NHFET 13) comprising layers 22, 24, 26, 28, 30. The NHFET device 13 has one or more n-type modulation doped QW channels and is positioned with the gate terminal on the top side and the collector terminal on the lower side which is the collector of the p-channel device. Therefore a non-inverted N-channel device is stacked upon an inverted p-channel device to form the active device structure.

The active device layer structure begins with n-type ohmic contact layer(s) 14 which enables the formation of ohmic contacts thereto. Deposited on layer 14 are one or more n-type layer(s) 16. Preferably, the doping of layer(s) 16 is such that it should not be depleted in any range of operation of the device, i.e. the total doping in this layer should exceed the total doping charge contained in the modulation doped layer of the p-type modulation doped QW structure 20 described below. This layer 16 also serves optically as a small part of the lower waveguide cladding for optical devices realized in this structure. Note that a majority of the lower waveguide cladding is provided by the lower DBR mirror 12 itself. Deposited on layer 16 is an undoped spacer layer 18. Layers 14, 16 and 18 serve electrically as part of the gate of the p-channel HFET 11. In this configuration, layer 14 achieves low contact resistance and layer 18 defines the capacitance of the p-channel HFET 11 with respect to the p-type modulation doped QW heterostructure 20. Deposited on layer 18 is a p-type modulation doped QW structure 20 that defines one or more quantum wells (which may be formed from strained or unstrained heterojunction materials). Deposited on the p-type modulation doped QW structure 20 is an undoped spacer layer 22, which forms the collector of the P-channel HFET device 11. All of the layers grown thus far form the P-channel HFET device 11 with the gate ohmic contact on the bottom.

Undoped spacer layer 22 also forms the collector region of the N-channel HFET device 13. Deposited on layer 22 is an n-type modulation doped QW structure 24 that defines one or more quantum wells (which may be formed from strained or unstrained heterojunction materials). Deposited on the n-type modulation doped QW structure 24 is an undoped spacer layer 26. Deposited on layer 26 are one or more p-type layer(s) 28. Preferably, the doping of layer(s) 28 is such that it should not be depleted in any range of operation of the device, i.e. the total doping in this layer should exceed the total doping charge contained in the modulation doped layer of the n-type modulation doped QW structure 24 described above. Deposited on layer 28 are one or more p-type ohmic contact layer(s) 30 which enable the formation of ohmic contacts thereto. In this configuration, layer 30 achieves low contact resistance and layer 26 defines the capacitance of the n-channel HFET 13 with respect to the n-type modulation doped QW heterostructure 24. Layers 28 and 30 serve electrically as part of the gate of the n-channel HFET 13.

Alternatively, the active device structure may be described as a pair of stacked quantum-well-base bipolar transistors formed on the bottom DBR mirror 12. The first of these is an n-type quantum-well-base bipolar transistor (comprising layers 14, 16, 18, 20 and 22) which has one or more p-type modulation doped quantum wells and is positioned with the emitter terminal on the lower side (i.e. on the mirror as just described) and the collector terminal on the upper side. The second of these is an n-type quantum-well-base bipolar transistor comprising layers 22, 24, 26, 28, and 30. This n-type quantum-well-base bipolar transistor has one or more n-type modulation doped quantum wells and is positioned with the emitter terminal on the top side and the collector terminal on the lower side (which is the collector of the p-type quantum-well-base bipolar transistor). Therefore a non-inverted n-channel device is stacked upon an inverted p-channel device to form the active device structure. In this configuration, the gate terminal of the p-channel HFET device 11 corresponds to the emitter terminal of the p-type quantum-well-base bipolar transistor, the p-type QW structure 20 corresponds to the base region of the p-type quantum-well-base bipolar transistor, spacer layer 22 corresponds to the collector region of both the p-type quantum-well-base bipolar transistor and the n-type quantum-well-base bipolar transistor, the n-type QW structure 24 corresponds to the base region of the n-type quantum-well-base bipolar transistor, and the gate terminal of the n-channel HFET device 13 corresponds to the emitter electrode of the n-type quantum-well-base bipolar transistor.

The epitaxial growth structures described above may be realized with a material system based on group III–V materials (such as a GaAs/AlGaAs). Alternatively, strained silicon heterostructures employing silicon-germanium (SiGe) layers may be used to realize the multilayer structures described herein. FIG. 1B illustrates an exemplary epitaxial growth structure utilizing group III–V materials for realizing the structure of FIG. 1A and the optoelectrical/electrical/optical devices formed from this structure in accordance with the present invention. The structure of FIG. 1B can be made, for example, using known molecular beam epitaxy (MBE) techniques. As shown, a first semiconductor layer 151 of AlAs and a second semiconductor layer 152 of GaAs are alternately deposited (with preferably at least seven pairs) upon a semi-insulating gallium arsenide substrate 149 in sequence to form the bottom distributed bragg reflector (DBR) mirror 12. The number of AlAs layers will preferably always be one greater than the number of GaAs layers so that the first and last layers of the mirror are shown as layer 151. In the preferred embodiment the AlAs layers 151 are subjected to high temperature steam oxidation to produce the compound $Al_xO_y$ so that a mirror will be formed at the designed center wavelength. Therefore the thicknesses of layers 151 and 152 in the mirror are chosen so that the final optical thickness of GaAs and $Al_xO_y$ are one quarter wavelength of the center wavelength $\lambda_D$. Alternatively, the mirrors could be grown as alternating layers of one quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the p-channel HFET (PHFET) 11, which has one or more p-type modulation doped quantum wells and is positioned with the gate terminal on the bottom (i.e. on the mirror 12 just described) and the collector terminal above. The second of these is an n-channel HFET (NHFET) 13, which has one or more n-type modulation doped quantum wells and is positioned with the gate terminal on top and the collector terminal below. The collector region of the NHFET device 13 also functions as the collector region of the PHFET device 11. However, the collector terminal of the NHFET device 13 is a p-type contact to p-type quantum well(s) disposed below (above) the collector region, while the collector terminal of the PHFET device 11 is a n-type contact to n-type quantum well(s) disposed above the collector region. Therefore a non-inverted n-channel device is stacked upon an inverted p-channel device to form the active device structure.

The active-device layer structure begins with layer 153 of N+ type GaAs that enables the formation of ohmic contacts thereto (for example, when contacting to the cathode terminal of a heterojunction thyristor device, the gate terminal of an inverted p-channel HFET device, the sub-collector terminal of an n-channel HFET device, or the emitter terminal of a p-type quantum-well-base bipolar device). Layer 153 has a typical thickness of 1000–3000 Å and a typical n-type doping of $3.5 \times 10^{18}$ cm$^{-3}$. The N+ doped GaAs layer 153 corresponds to the ohmic contact layer 14 of FIG. 1A. Deposited on layer 153 is layer 154 of n-type $Al_{x1}Ga_{1-x1}As$ with a typical thickness of 500–3000 Å and a typical doping of $1 \times 10^{17}$ cm$^{-3}$. The parameter x1 of layer 154 is nominally 70% and preferably in the range between 70% to 75%. This layer serves as part of the PHFET gate and optically as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. Next are 4 layers (155a, 155b, 155c, and 155d) of $Al_{x2}Ga_{1-x2}As$. These 4 layers (collectively, 155) have a total thickness about 380–500 Å and where x2 is about 15%. The first layer 155a is about 60–80 Å thick and is doped N+ type in the form of delta doping. The second layer 155b is about 200–300 Å thick and is undoped. The third layer 155c is about 80 Å thick and is doped P+ type in the form of delta doping. And the fourth layer 155d is about 20–30 Å thick and is undoped to form a spacer layer. This layer forms the lower separate confinement heterostructure (SCH) layer for the laser, amplifier and modulator devices. The n-type AlGaAs layer 154 and n-type AlGaAs layer 155a correspond to the n-type layer(s) 16 of FIG. 1A, and the undoped AlGaAs layer 155b corresponds to the undoped spacer layer 18 of FIG. 1A.

The next layers define the quantum well(s) that form the inversion channel(s) during operation of the PHFET 11. For a strained quantum well, this consists of a spacer layer 156 of undoped GaAs that is about 10–25 Å thick and then combinations of a quantum well layer 157 that is about 40–80 Å thick and a barrier layer 158 of undoped GaAs. The quantum well layer 157 may be comprised of a range of compositions. In the preferred embodiment, the quantum well is formed from a $In_{0.2}Ga_{0.8}AsN$ composition with the nitrogen content varying from 0% to 5% depending upon the desired natural emission frequency. Thus, for a natural emission frequency of 0.98 $\mu$m, the nitrogen content will be 0%; for a natural emission frequency of 1.3$\mu$m, the nitrogen content will be approximately 2%; and for a natural emission frequency of 1.5$\mu$m, the nitrogen content will be approximately 4–5%. The well barrier combination will typically be repeated (for example, three times as shown), however single quantum well structures may also be used. Unstrained quantum wells are also possible. Following the last barrier of undoped GaAs is a layer 159 of undoped $Al_{x2}Ga_{1-x2}As$ which forms the collector of the PHFET device 11 and is about 0.5 $\mu$m in thickness. All of the layers grown thus far form the PHFET device 11 with the gate contact on the bottom. The layers between the P+ AlGaAs layer 155c and the last undoped GaAs barrier layer 158 correspond to the p-type modulation doped heterojunction QW structure 20 of FIG. 1A. Undoped AlGaAs layer 159 corresponds to the undoped spacer layer 22 of FIG. 1A.

Layer 159 also forms the collector region of the NHFET device 13. Deposited on layer 159 are two layers (collectively 160) of undoped GaAs of about 200–250 Å total thickness, which form the barrier of the first n-type quantum well. Layer 160 is thicker than the normal barrier layer of about 100 Å because it accommodates the growth interruption to change the growth temperature from 610° C. (as required for optical quality $Al_{x2}Ga_{1-x2}As$ layers) to about 530° C. for the growth of InGaAs. Therefore layer 160 includes a single layer 160a of about 150 Å and a barrier layer 160b of about 100 Å. The next layer 161 is the quantum well of $In_{0.2}Ga_{0.8}As$, which is undoped and about 40–80 Å in thickness. It is noted that the n-type quantum well layer 161 need not be of the same formulation as the p-type quantum well layer 157. The barrier layer 160b of 100 Å and quantum well layer 161 may be repeated, e.g., three times. Then there is a barrier layer 162 of about 10–30 Å of undoped GaAs which accommodates a growth interruption and a change of growth temperature. Next there are four layers (collectively 163) of $Al_{x2}Ga_{1-x2}As$ of about 300–500 Å total thickness. These four layers (163) include a spacer layer 163a of undoped $Al_{x2}Ga_{1-x2}As$ that is about 20–30 Å thick, a modulation. doped layer 163b of N+ type doping of $Al_{x2}Ga_{1-x2}As$ (with doping about $3.5\times10^{18}$ cm$^{-3}$) that is about 80 Å thick, a spacer layer 163c of undoped $Al_{x2}Ga_{1-x2}As$ that is about 200–300 Å thick, and a P+ type delta doped layer 163d of $Al_{x2}Ga_{1-x2}As$ (with doping about $3.5\times10^{18}$ cm$^{-3}$) that is about 60–80 Å. Layers 163b and 163d form the top plate and bottom plate of a parallel plate capacitor which forms the field-effect input to all active devices. The doping species for layer 163d is preferably carbon (C) to ensure diffusive stability. In contrast to layer 163b which is always depleted, layer 163d should never be totally depleted in operation. For the optoelectronic device operation, layer 163 is the upper SCH region. The layers between the undoped GaAs barrier layer 160a and the N+ AlGaAs layer 163b correspond to the n-type modulation doped heterojunction QW structure 24 of FIG. 1A. Undoped AlGaAs layer 163c corresponds to the undoped spacer layer 26 of FIG. 1A.

One or more layers (collectively 164) of p-type $Al_{x1}Ga_{1-x1}As$ are deposited next to form part of the upper waveguide cladding for the laser, amplifier and modulator devices. Note that a majority of the upper waveguide cladding for waves propagating in the guide formed by the optically active region of the device is provided by the upper dielectric mirror itself. The upper dielectric mirror causes the light to be guided partially as a dielectric waveguide and partially as a mirror waveguide. Preferably, layer 164 has a thickness on the order of 500–1500 Å, and includes a first thin sublayer 164a that is 10–20 Å thick and has a P+ doping of $10^{19}$ cm$^{-3}$ and a second sublayer 164b that is 700 Å thick and has a P doping of $1\times10^{17}$–$5\times10^{17}$ cm$^{-3}$. The parameter x1 of layer 164 is preferably about 70%. The p-type layers 163d, 164a, 164b correspond to the p-type layer(s) 28 of FIG. 1A.

Deposited next is an ohmic contact layer 165 (which may comprise a single layer of GaAs or a combination of GaAs (165a) and InGaAs (165b) as shown). Layer 165 is about 50–100 Å thick and is doped to a very high level of P+ type doping (about $1\times10^{20}$ cm$^{-3}$) to enable formation of ohmic contacts thereto (for example, when contacting to the anode terminal of a heterojunction thyristor device).

Alternatively, the active device structure may be described as a pair of stacked quantum-well-base bipolar transistors formed on the bottom DBR mirror (layers 151/152). The first of these is an p-type quantum-well-base bipolar transistor (comprising layers 153 through 159) which has one or more p-type modulation doped quantum wells and is positioned with the emitter terminal on the lower side (i.e. on the bottom mirror as just described) and the collector terminal on the upper side. The second of these is an n-type quantum-well-base bipolar transistor (comprising layers 159 through 165b) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the cathode terminals 40a, 40b of the heterojunction thyristor device corresponds to the emitter electrode of the p-type quantum-well-base bipolar transistor, the p-type QW structure (layers 155c though 158) corresponds to the base region of the p-type quantum-well-base bipolar transistor, spacer layer 159 corresponds to the collector region of both the p-type quantum-well-base bipolar transistor and the n-type quantum-well-base bipolar transistor, the n-type QW structure (layers 160a through 163b) corresponds to the base region of the n-type quantum-well-base bipolar transistor, and the anode terminals 36a, 36b of the heterojunction thyristor device corresponds to the emitter electrode of the n-type quantum-well-base bipolar transistor.

Figure 1C:
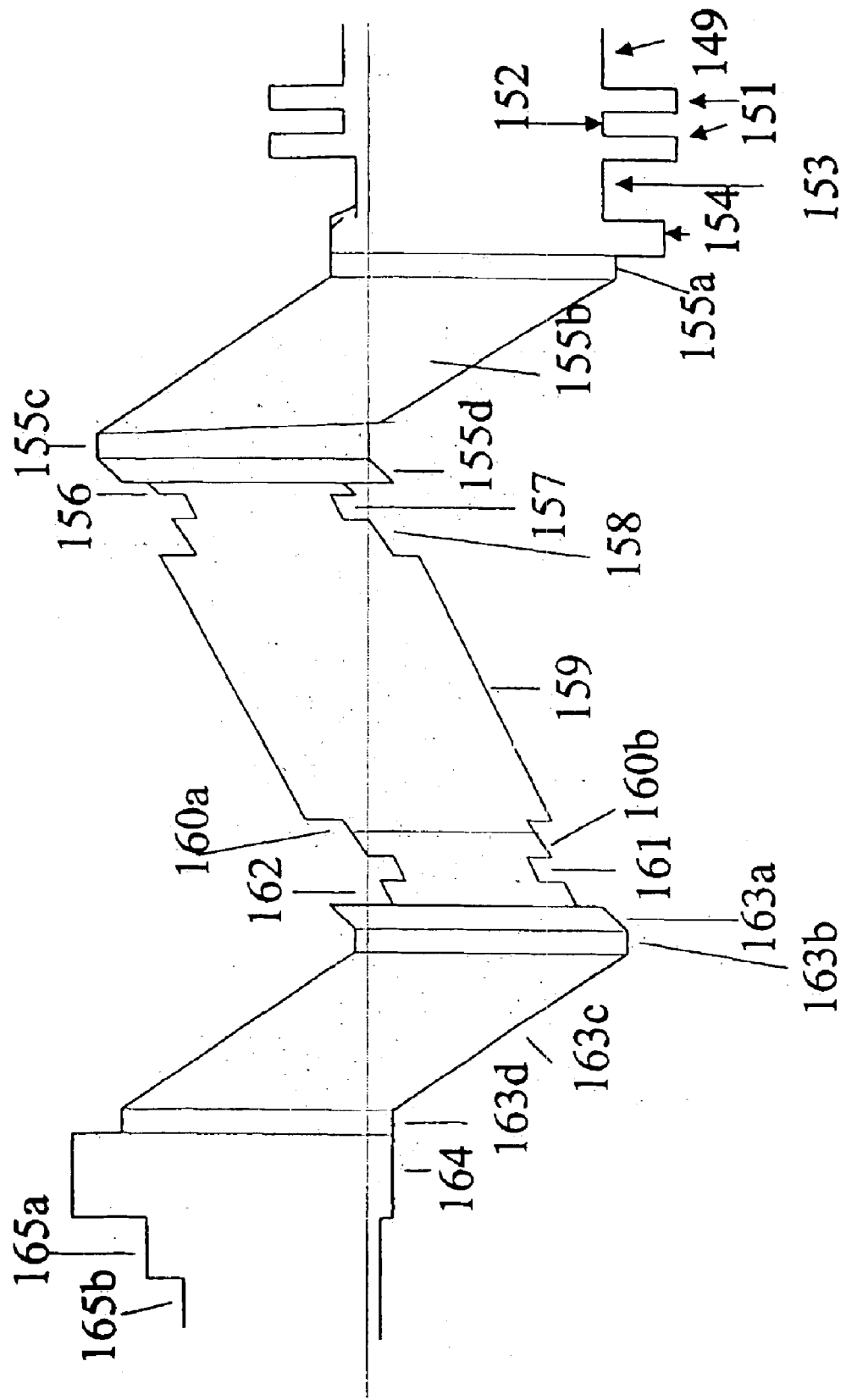
FIG. 1C shows the energy band diagram of the structure of FIG. 1B.

The band diagram of the structure of FIG. 1B is shown in FIG. 1C.

To form a resonant cavity device where light is emitted from and/or emitted from the device laterally (i.e., from a direction normal to the cross sections of FIG. 1A and 1B), a diffraction grating (for example, as described in detail in U.S. Pat. No. 6,031,243) and top dielectric mirror are formed over the active device structure. For resonant cavity lasing devices, the diffraction grating performs the function of diffracting light produced by the resonant cavity into light propagating laterally in a waveguide which has the top dielectric mirror and bottom DBR mirror as waveguide cladding layers. For resonant cavity detecting devices, the diffraction grating performs the function of diffracting incident light that is propagating in the lateral direction into a vertical mode, where it is absorbed resonantly in the resonant cavity.

Alternatively, light may exit (and/or enter) the resonant cavity in a vertical direction through an optical aperture (not shown) in the top surface (or bottom surface) of the device. In this case, the diffraction grating is omitted, and the top dielectric mirror and bottom DBR mirror define a resonant cavity for the vertical emission (and/or absorption) of light such that the device operates as a vertical cavity surface emitting laser (detector)

The optical path length between the bottom DBR mirror and top dielectric mirror preferably represents an integral number of ½ wavelength at the designated wavelength. This optical path length is controlled by adjusting the depth of one or more layers of the multilayer structure to thereby enable this condition. For example, the thickness of layer 164 and/or layer 159 may be adjusted to enable this condition.

The structure of FIGS. 1A and 1B may be used to realize various electronic devices and optoelectronic devices, including heterojunction thyristor devices, an array of transistor devices (including n-channel HFET devices, p-channel HFET devices, n-type quantum-well-base bipolar transistors and p-type quantum-well-base bipolar transistors), and waveguide devices.

Figure 2A:
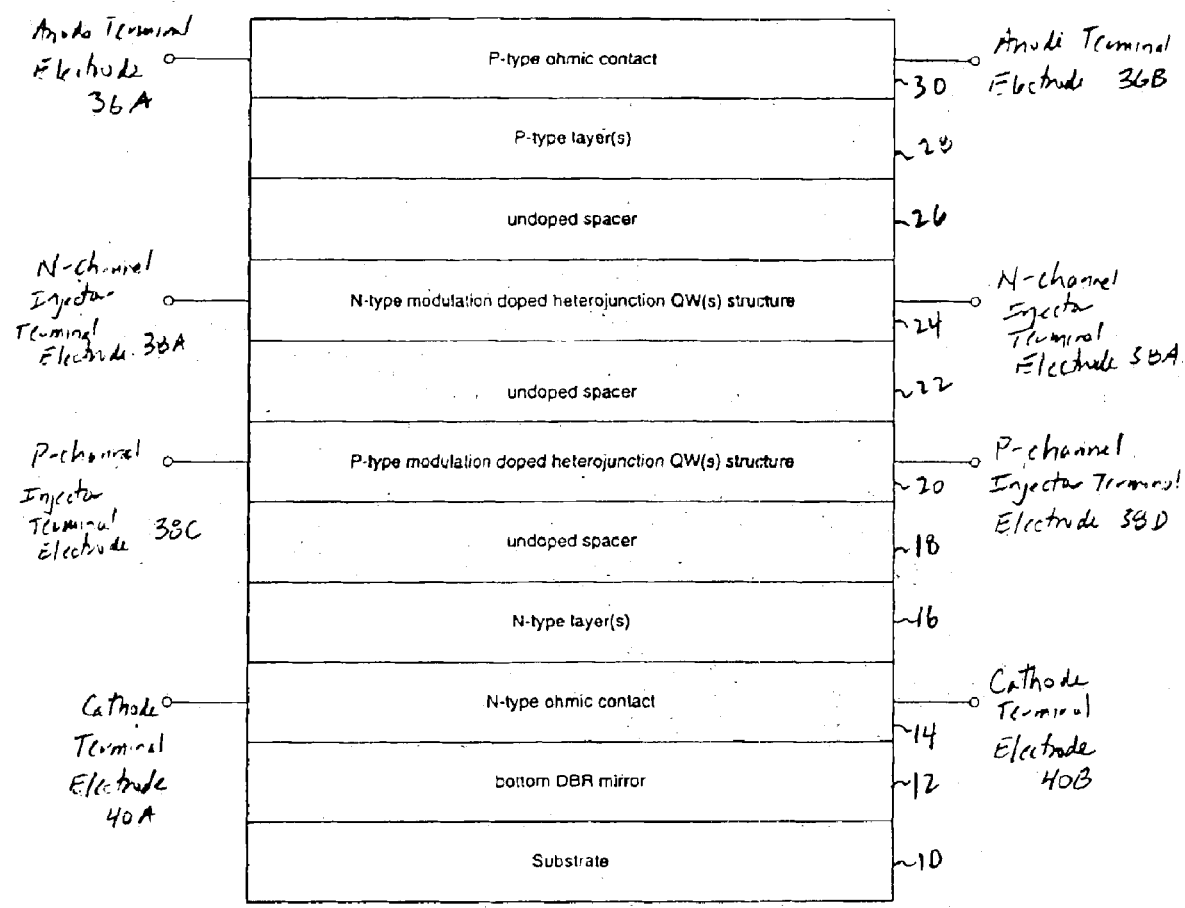
FIG. 2A is a schematic view showing the generalized construction of an exemplary heterojunction thyristor device formed from the layer structure of FIG. 1A.

FIG. 2A illustrates an exemplary heterojunction thyristor device realized from the multilayer sandwich of FIG. 1A. As shown, one or more anode terminal electrodes (two shown as 36A and 36B) are operably coupled to the p-type ohmic contact layer 30, one or more n-channel injector terminal electrodes (two shown as 38A, 38B) are operably coupled to the n-type QW structure 24, one or more p-channel injector terminal electrodes (two shown as 38C, 38D) are operably coupled to the p-type QW structure 20, and one or more collector terminal electrodes (two shown as 40A, 40B) are operably coupled to the n-type ohmic contact layer 14. In alternative embodiments, the p-channel injector terminals (38C, 38D) may be omitted. In such a configuration, the N-channel injector terminals (38A, 38B), which are coupled to the n-type inversion QW structure 24 are used to control charge in such n-type inversion QW channel(s) as described herein. In yet another alternative embodiment, the N-channel injector terminals (38A, 38B) may be omitted. In such a configuration, the p-channel injector terminals (38C, 38D), which are coupled to the p-type inversion QW structure 20 are used to control charge in such p-type inversion QW channel(s) as described herein.

Figure 2B:
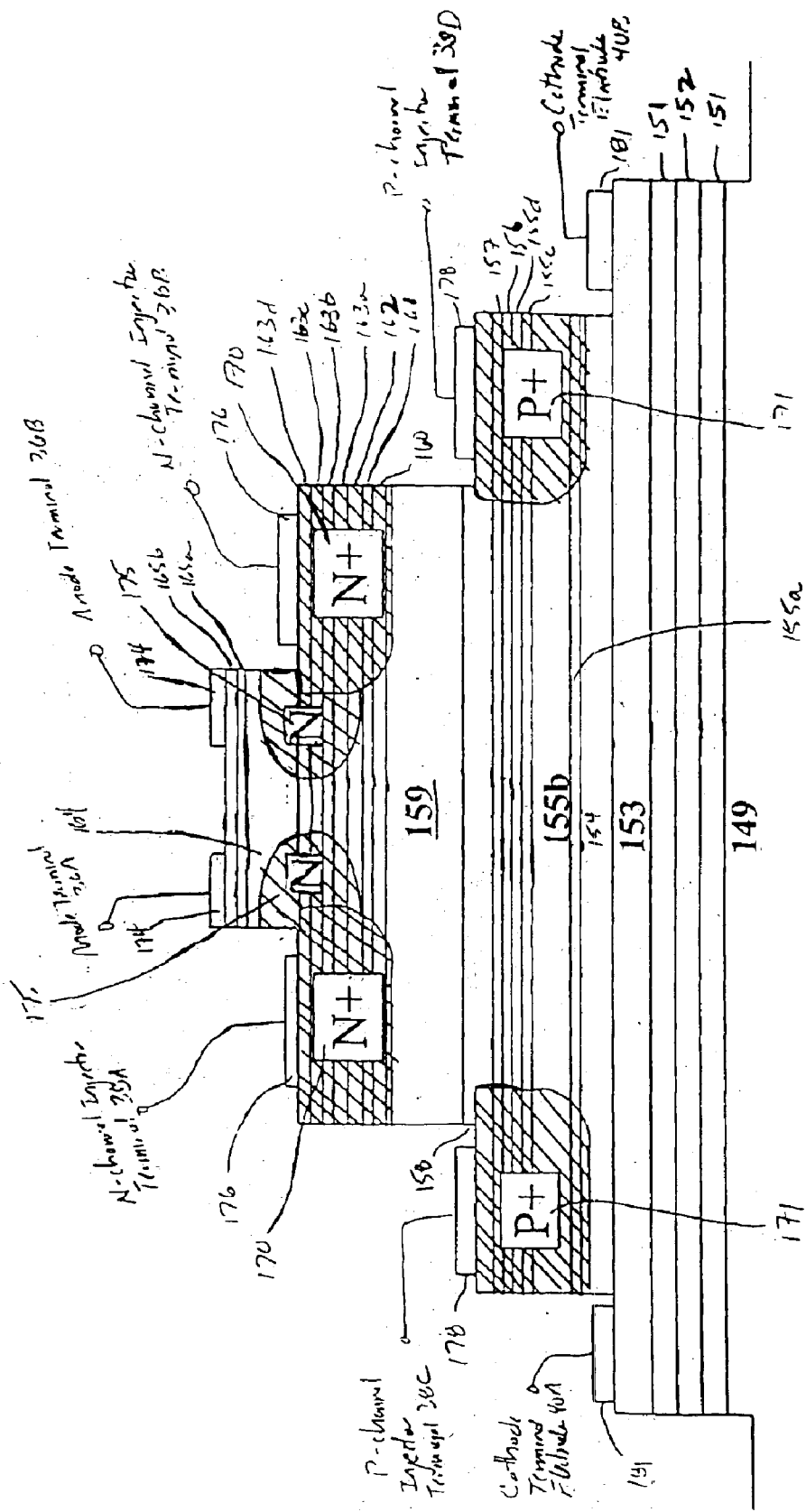
FIG. 2B is a cross-sectional schematic view showing the generalized construction of an exemplary heterojunction thyristor device formed from the layer structure of FIG. 2A.

FIG. 2B illustrates an exemplary heterojunction thyristor device realized from the multilayer sandwich of FIGS. 1B and 1C. To connect to the anode terminal of the device, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. Then an ion implant 175 of n-type is performed using a photomask that is aligned to the alignments marks, and an aperture is defined by the separation between the implants 175. The implants 175 create a p-n junction in the layers between the n-type quantum well(s) and the surface, and the aperture between the implants defines the region in which the current may flow. The current cannot flow into the n-type implanted regions 175 because of the barrier to current injection. For optoelectronic applications, the current-funneling characteristics provided by the implant 175 advantageously provide for improved response times in turning on the device (e.g., for lasing applications and/or detecting applications). Note that for lasing applications, the laser threshold condition is reached before the voltage for turn-on of this barrier. Note that for electronic applications that do not involve light processing (such as the thyristor-based operational amplifier discussed below), the implant 175 may be omitted.

Following the implant 175, a metal layer 174 (preferably comprising tungsten) is deposited and defined to form anode terminals 36A and 36B (which collectively form the anode terminal 36) of the device.

Then an ion implant 170 of n+-type is performed using the metal 174 as a mask that is self-aligned to the metal features, to thereby form contacts to the n-type QW inversion channel(s). During this operation, the structure is etched down near the n-type modulation doped quantum well structure (for example, near layer 163c) and the resulting mesas are subject to the N+ ion implants 170, which contact the n-type QW inversion channel(s) as shown.

Then an ion implant 171 of p+-type is performed using a photomask that is aligned to the alignments marks, to thereby form contacts to the p-type QW inversion channel(s). During this operation, the structure is etched down near the p-type modulation doped quantum well structure (for example, near layer 159) and the resulting mesas are subject to P+ ion implants 171, which electrically contact the P-type QW inversion channel(s) as shown.

The resultant structure is then etched to expose regions of the N+ layer 153. These exposed regions are used to form ohmic contacts to the cathode terminal electrode of the device as described below.

Next the device is subjected to a rapid thermal anneal (RTA) of the order of 900° C. or greater to activate all implants. Then the device is isolated from other devices by an etch down to the semi-insulating substrate 149, which includes an etch through the mirror pairs 151/152 of AlAs/GaAs. At this point, the device is oxidized in a steam ambient to create layers 179/180, which form the top dielectric mirror as described below. During this oxidation step, the exposed sidewalls of the etched AlGaAs layers are passivated by the formation of very thin layers of oxide. The final step in the fabrication is the deposition (preferably via lift off) of metal contacts. These contacts come in three forms. One is the metal layer 176 (preferably comprising an n-type Au alloy metal such as AuGe/Ni/Au) deposited on the N+ type implants 170 to form the N-channel injector terminal electrodes 38A, 38B. The second is the metal layer 178 (preferably comprising an p-type Au metal alloy such as AuZn/Cr/Au) deposited on the P+ type implant 171 to form the p-channel injector terminal electrodes 38C, 38D. The third is the metal layer 181 (preferably comprising an n-type Au alloy metal such as AuGe/Ni/Au) deposited on the mesas at the N+ layer 153 to form the cathode terminal electrodes 40A, 40B of the device.

In alternative embodiments, the P+ ion implants 171 (and corresponding P-channel injector terminals 38C and 38D) may be omitted. In such a configuration, the N-channel injector terminals 38A and 38B (which are coupled to the n-type inversion QW channel(s) of the NHFET device 13 by the N+ ion implants 170) are used to control charge in such n-type inversion QW channel(s) as described herein. In yet another alternative embodiment, the N+ ion implants 170 (and corresponding N-channel injector terminals 38A and 38B) may be omitted. In such a configuration, the P-channel injector terminals 38C and 38D (which are coupled to the p-type inversion QW channel(s) of the PHFET 11 device by the P+ ion implants 171) are used to control charge in such p-type inversion QW channel(s) as described herein.

To form a device suitable for in-plane optical injection into a resonant vertical cavity and/or in-plane optical emission from the resonant vertical cavity, a diffraction grating 32 (for example, as described in detail in U.S. Pat. No. 6,031,243) and top dielectric mirror are formed in conjunction with the active device structure as described above. To form a device suitable for vertical optical injection into (and/or optical emission from) a resonant vertical cavity, the diffraction grating 32 is omitted. The top dielectric mirror is preferably created by the deposition of one or more dielectric layer pairs (179, 180), which typically comprise $SiO_2$ and a high refractive index material such as GaAs, Si, or GaN.

Figure 2C:
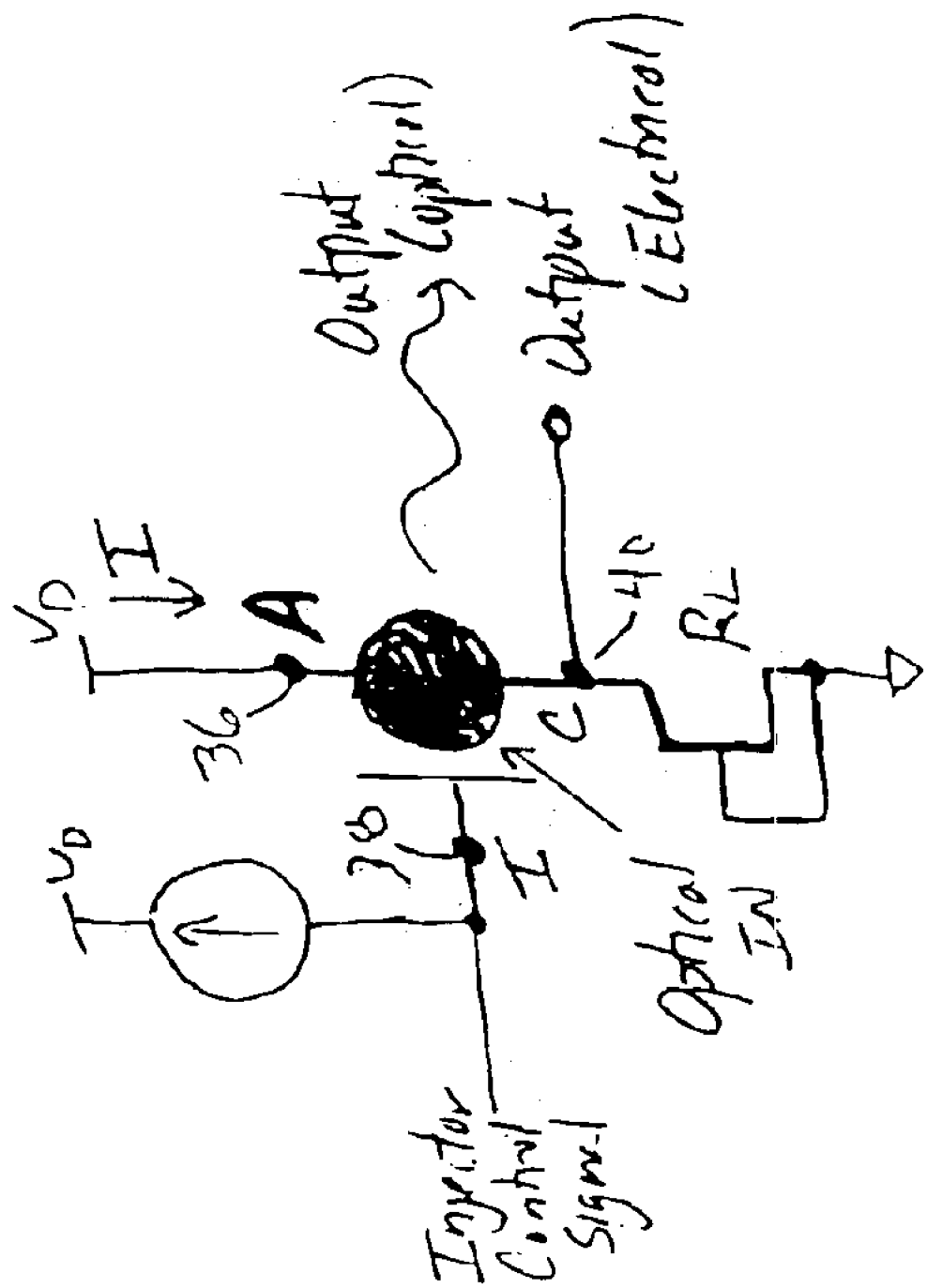
FIG. 2C is a pictorial illustration of an exemplary configuration of a heterojunction thyristor device as an light emitting device (laser)/light detecting device (detector).
Figure 2D:
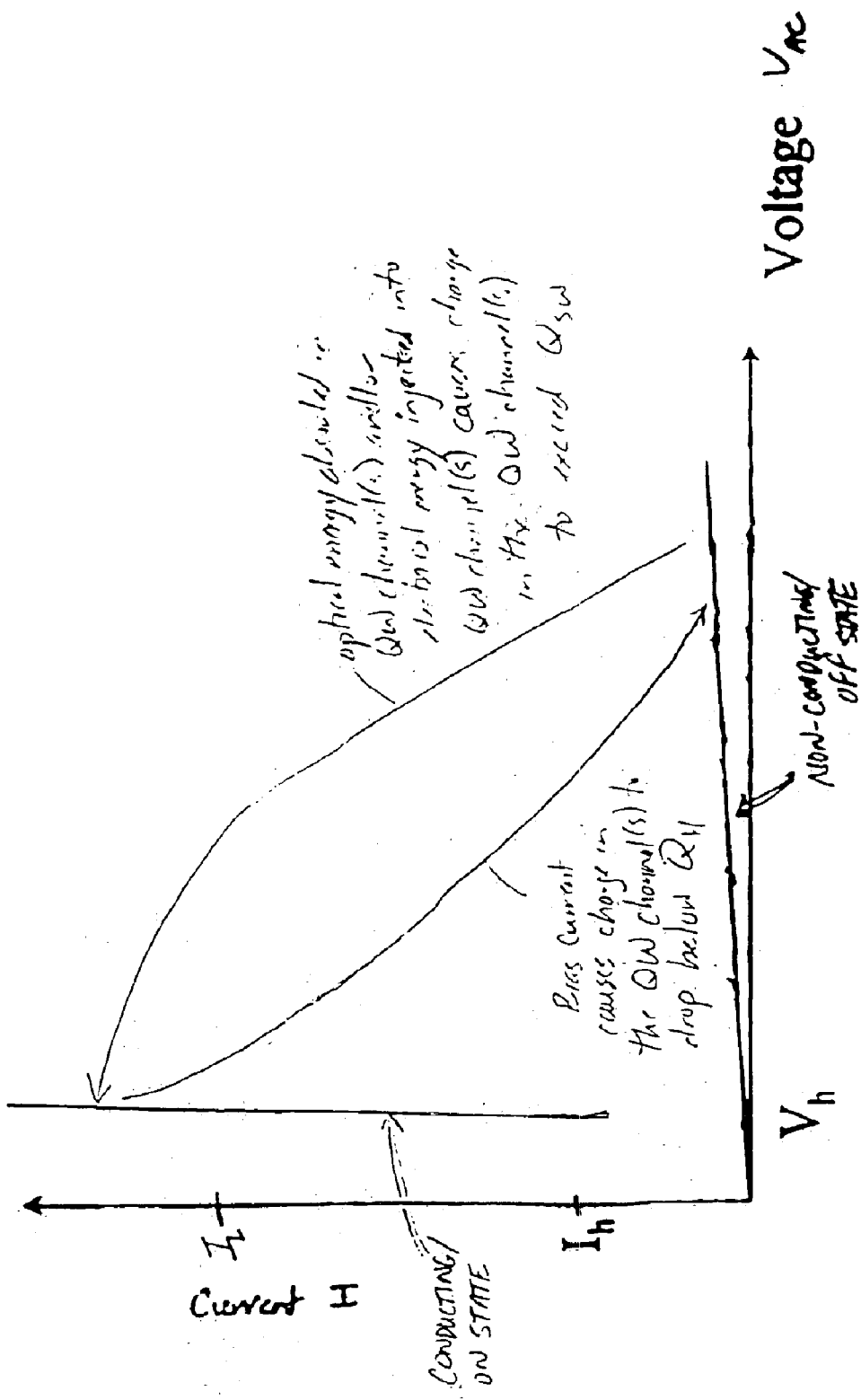
FIG. 2D is a graph showing the current-voltage characteristics of the thyristor-based laser/detector of FIG. 2C.

Note that for electronic devices that do not process optical signals (such as the thyristor-based operational amplifier described below), the bottom DBR mirror (in addition to the top dielectric mirror and diffraction grating) serve no purpose and thus may be omitted from the multilayer epitaxial structure. However, in many instances, the bottom DBR mirror (in addition to the top dielectric mirror and diffraction grating) are useful in integrating additional optoelectronic circuits (such as lasers, detectors, modulators, etc.) with the thyristor-based operational amplifier FIGS. 2C and 2D illustrate the configuration of a thyristor device as described above for light emitting/light detecting operations. The device switches from a non-conducting/OFF state (where the current I is substantially zero) to a conducting/ON state (where current I is substantially greater than zero) when: i) the anode terminal 36 is forward biased (e.g. biased positively) with respect to the cathode terminal 40; and ii) optical energy is supplied and resonantly absorbed in the QW channel(s) of the device and/or electrical energy is injected via the injector terminal 38 into the QW channel(s) of the device such that charge in the QW channel(s) is greater than the critical switching charge $Q_{CR}$, which is that charge that reduces the forward breakdown voltage such that no off state bias point exists. The critical switching charge $Q_{CR}$ is unique to the geometries and doping levels of the device. The device switches from the conducting/ON state to the non-conducting/OFF state when the charge in the QW channel(s) of the device decreases below the holding charge $Q_H$, which is the critical value of the channel charge which will sustain holding action.

The thyristor device can be configured to operate as a laser by biasing the device such that the current I in the conducting/ON state is above the threshold for lasing $I_L$ as shown in FIG. 2D. In such a configuration, the lasing action produces an output optical signal that is emitted from the device and a corresponding output electrical signal as shown in FIG. 2C. Such lasing action can be triggered by an optical control signal resonantly absorbed in the QW channel(s) of the device and/or an electrical control signal injected into the QW channel(s) of the device.

The thyristor device can also be configured to operate as an optical detector by biasing the devices such that incident light will be resonantly absorbed and switch the device into its ON state, which produces an output electrical signal as shown in FIG. 2C. In the ON state, the device may produce a corresponding output optical signal via lasing action if the device is biased such that the current I in the ON state is above the threshold for lasing $I_L$.

In addition, the thyristor device can be configured to operate as an optically-controlled (or electrically-controlled) sampling device (e.g., sampling switch) wherein an input terminal is selectively coupled to an output terminal in response to an optical control signal (or an electrical control signal). The input terminal and output terminal correspond to the n-channel injector terminal pair (or p-channel injector terminal pair) of the devices shown in FIGS. 2A and 2B. For optical control, the heterojunction thyristor device is biased such that the optical control signal is resonantly absorbed by the device and switches the device between the ON state/OFF state. For electrical control, the thyristor device is biased such that the electrical control signal is injected into the QW channel(s) of the device and switches the device between the ON state/OFF state. In the ON state, the n-channel injector terminal pair (or p-channel injector terminal pair) are operably coupled together (with minimal potential voltage difference there between). In the OFF state, the n-channel injector terminal pair (or p-channel injector terminal pair) are electrically isolated from one another.

In addition, the thyristor device can be configured to operate as various other optoelectronic components including a digital optical modulator and optical amplifier as described below.

A digital optical modulator operates in one of two distinct optical states in modulating an input optical signal. In optical state 1, there is substantially no loss to the input optical signal via absorption. In optical state 2, substantially all of the input optical signal is absorbed. To configure the heterojunction thyristor device as a digital optical modulator, an optical path is provided through the device either vertically or in the waveguide mode, and an input signal is applied to the n-channel injector terminal. When the input signal produces a bias between the n-channel injector terminal and the anode terminal 36 sufficient to produce charge in the QW channel(s) of the device greater than the critical switching charge $Q_{CR}$, the heterojunction thyristor device operates in its conducting/ON state. The device is biased such that the current I through the device in the ON state is substantially below the threshold for lasing (preferably about 0.5 to 0.7 of the lasing threshold current). In this configuration, in the ON state, the device operates in optical state 1 whereby there is substantially no loss to the input optical signal via absorption. When the input signal produces a reverse bias between the n-channel injector terminal and the anode terminal 36, charge is drawn from the injector terminal such that the channel charge in the QW channel(s) of the device falls below the hold charge $Q_H$, and the heterojunction thyristor device operates in its non-conducting/OFF state. In the OFF state, the device operates in optical state 2 whereby substantially all of the input optical signal is absorbed. Preferably, the digital optical modulator includes a diffraction grating as described above. This grating enhances the absorption and enables modulation between the 0 and 1 states in the shortest possible length.

An optical amplifier amplifies an input optical signal to produce a corresponding output optical signal with an increased intensity level. To configure the heterojunction thyristor device as an optical amplifier, a forward bias is applied between the n-channel injector terminal and cathode terminal 40, and a forward bias is applied between the anode terminal 36 and cathode terminal 40 through a load resistance $R_L$ that sets the current I in the ON state at a point substantially below lasing threshold $I_L$. In this configuration, in the ON state, the device amplifies an input optical signal to produce a corresponding output optical signal with an increased intensity level. The optical amplifier may be switched into and out of the ON state by applying forward and reverse biases to the n-channel injector terminal with respect to the anode terminal 36 as described above. The gain of the optical amplifier in the ON state and thus the output signal intensity level may be changed by adjusting the current I in the ON state. Preferably, the optical amplifier operates without the existence of a diffraction grating in the structure. In this configuration, there will be no interaction between the waveguide traveling wave and the vertical cavity oscillation. The gain is obtained by using the high density of electrons and holes in the vertical laser above threshold.

In addition, the multilayer structure of FIGS. 1A and 1B can be used to realize various other optoelectronic components including a PIN detector and analog optical modulator as described below.

A PIN detector generates an electrical signal proportional to the optical signal incident thereon. To configure the multilayer structure of FIGS. 1A and 1B as a PIN detector, the n-type ohmic contact layer (which is coupled to the cathode terminal 40 of the heterojunction thyristor device) floats electrically and a reverse bias is applied between the p-type ohmic contact layer 30 (which is coupled to the anode terminal 36 of the heterojunction thyristor device) and the n-channel injector terminal(s) (38A, 38B). Such a configuration creates a reverse-bias PIN junction that generates an electrical signal (photocurrent) proportional to the optical signal incident to the vertical cavity. Preferably, the PIN detector incorporates a diffraction grating for efficient operation.

An analog optical modulator modulates an input optical signal linearly over a range of modulation values. To configure the multilayer structure of FIGS. 1A and 1B as an analog optical modulator, the n-type ohmic, contact layer (which is coupled to the cathode terminal 40 of the heterojunction thyristor device) floats electrically. Similar to the heterojunction thyristor device, an optical path is provided through the device either vertically or in the waveguide mode, and an input signal is applied to the anode terminal 36 with respect to the injector terminal(s) 38 such that the anode terminal 36 is biased positively with respect to the injector terminal(s) 38. In this configuration, the voltage at the anode terminal 36 is varied over a range of voltage levels where absorption of the device varies linearly. The top of the voltage range (where minimum absorption occurs) is defined by the operation point where conduction occurs from the anode terminal 36 to the injector terminal(s) 38. Preferably, the analog modulator incorporates a diffraction grating for efficient operation.

The structures of FIGS. 1A and 1B may also be used to produce an in-plane passive waveguide. In such a configuration, the diffraction grating, the electrode metal layers, and any contacts to n+ and p+ regions are omitted in order to minimize waveguide loss. The waveguide ridge cross-section is formed by a combination of several mesas, which are formed by vertical/horizontal surfaces formed in the layers between the top dielectric mirror and the bottom DBR mirror, to provide both laterally guiding and vertical guiding of light therein.

The structure of FIGS. 1A and 1B may also be used to realize various transistor devices, including n-channel HFET devices, p-channel HFET devices, n-type quantum-well-base bipolar transistors and p-type quantum-well-base bipolar transistors as described in detail in U.S. Pat. Nos. 6,031,243; 6,031,243; U.S. patent application Ser. No. 09/556,285, filed on Apr. 24, 2000; U.S. patent application Ser. No. 09/798,316, filed on Mar. 2, 2001, International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238 filed on Apr. 26, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942 filed on Jan. 13, 2003; each of these references incorporated by reference above in its entirety.

In accordance with the present invention, a thyristor device as described above is configured to operate as an operational amplifier. In this configuration, the thyristor device is biased near the point where the device switches into the ON state but below this point such that switching into the ON state is inhibited. In this region, there is a large inverting voltage gain between the n-channel injector terminal and the cathode terminal and between the p-channel injector terminal and the anode terminal. When a single-ended input signal ($V_{in-}$) is supplied to the n-channel injector terminal, the input signal is amplified by the device in accordance with the large inverting open-loop voltage gain (represented by a gain factor of $-A$) to produce a corresponding amplified single-ended output signal ($V_{out+}$) at the cathode terminal of the device, where $V_{out+} \approx -AV_{in-}$. Similarly, when a single-ended input signal ($V_{in+}$) is supplied to the p-channel injector terminal, the input signal is amplified by the device in accordance with the large inverting open-loop voltage gain to produce a corresponding amplified single-ended signal ($V_{out-}$) at the anode terminal of the device, where $V_{out-} \approx -AV_{in+}$. When a differential input signal ($V_{in+} - V_{in-}$) is supplied to the p-channel injector terminal and the n-channel injector terminal, respectively, the differential input signal is amplified by the device in accordance with the large inverting open-loop voltage gain to produce a corresponding amplified single-ended output signal ($V_{out+}$) at the cathode terminal of the device, where $V_{out+} \approx A(V_{in+} - V_{in-})$, and also produce an amplified single-ended output signal ($V_{out-}$) at the anode terminal of the device with opposite polarity, where $V_{out-} \approx -A(V_{in+} - V_{in-})$. The two output signals ($V_{out+}$ and $V_{out-}$) produced at the cathode terminal and anode terminal of the device can be used to provide a differential output signal ($V_{out+} - V_{out-}$) that represents an amplified version of the differential input signal where ($V_{out+} - V_{out-}) \approx 2A(V_{in+} - V_{in-})$. In this manner, the thyristor-based amplifier device applies a substantially linear open-loop voltage gain to the input signal(s) supplied thereto for output via the output node of the device.

Turning now to FIG. 3A1, there is shown a realization of a thyristor-based operational amplifier/high gain amplifier circuit in accordance with the present invention. Such configuration is provided by coupling the $V_{in-}$ terminal to the n-channel injector terminal of the thyristor device and coupling the $V_{in+}$ terminal to the p-channel injector terminal of the thyristor device. Preferably, a coupling capacitor $C_{c1}$ is disposed between the $V_{in-}$ terminal and the n-channel injector terminal of the thyristor device for DC isolation, and a coupling capacitor $C_{c2}$ is disposed between the $V_{in+}$ terminal and the p-channel injector terminal of the thyristor device for DC isolation as shown. DC bias current levels $J_{inN}$ and $J_{outP}$ are supplied to the n-channel injector terminal and p-channel injector terminal of the device by current sources $CS_N$ and $CS_P$ as shown. A first bias resistance $R_{B1}$ is coupled between a positive potential source (e.g., $V_{DD}$) and the anode terminal of the device. A second bias resistance $R_{B2}$ is coupled between the cathode terminal of the device and a ground potential source (or negative potential source). As shown in FIG. 3A2, the switching voltage at the anode terminal of the device is set by a DC bias line (which is dictated by the resistance of the first bias resistor $R_{B1}$ and the second bias resistor $R_{B2}$) as well as the DC bias current $J_{inN}$ supplied to the n-channel injector terminal and the DC bias current $J_{outP}$ supplied to the p-channel injector terminal. Importantly, the DC bias point is selected such that it is near the point where the device switches into the ON state but below this point such that switching into the ON state is inhibited. This is accomplished with a bias line that intersects the current/voltage curve of the device at only one point, which occurs well below the holding current condition (where the current J is near $J_H$ as shown). Also note that the switching voltage increases when the DC bias current $J_{outP}$ is increased, while the switching voltage decreases when the DC bias current $J_{inN}$ is increased. Preferably, the sources $CS_N$ and $CS_P$ and the bias resistors $R_{B1}$ and $R_{B2}$ are realized with transistor devices (such as p-channel HFETs or n-channel HFETs) that are integrally formed with the thyristor device utilizing a common epitaxial growth structure (for example, the multilayer structures described above with respect to FIGS. 1A or 1B).

As shown in FIGS. 3A3, the DC bias current levels $J_{inN}$ and $J_{outP}$ can be manipulated to define the open loop voltage gain A of the device, which is the ratio of the output voltage level (e.g., the voltage level at the cathode terminal) with respect to input voltage level (e.g., the voltage level at the n-channel injector terminal). Larger open loop voltage gain values are provided by increasing the DC bias current level $J_{inN}$ and/or by increasing the DC bias current level $J_{outP}$. Thus, to configure a heterojunction thyristor device as part of an operational amplifier/high gain amplifier circuit, the DC bias current levels $J_{inN}$ and $J_{outP}$ supplied to the n-channel injector terminal and p-channel injector terminal of the device by current sources $CS_N$ and $CS_P$ are selected to be in correspondence with the desired gain value. In the exemplary configuration shown, an open loop gain A on the order of 300,000 is desired. This is provided by a DC bias current $J_{inN}$ on the order of $2.5\times10^{-5}$ A/cm$^2$ and a DC bias current $J_{outP}$ on the order of $4\times10^{-3}$ A/cm$^2$, which corresponds to a switching voltage on the order of 5 volts as shown in FIGS. 3A3 and 3A4. The DC bias current levels $J_{inN}$ and $J_{outP}$ may be adjusted to provide for different open loop gain values. For example, a DC bias current $J_{inN}$ on the order of $2\times10^{-5}$ A/cm$^2$ and a DC bias current $J_{outP}$ on the order of $4\times10^{-3}$ A/cm$^2$ corresponds to a switching voltage on the order of 6.5 volts and an open loop gain of 280,000 as shown in FIGS. 3A3 and 3A4. The bias resistors $R_{B1}$ and $R_{B2}$ are selected such that the DC bias point, which is dictated by the intersection of the bias line and the appropriate current/voltage curve as shown, occurs at (or substantially near) the desired switching voltage level. This is accomplished by identifying the current J through the device which corresponds to the desired switching voltage level. In the exemplary configuration, a current J on the order of $1\times10^{-3}$ A/cm$^2$ corresponds to the desired switching voltage level of 5 volts. The bias resistors $R_{B1}$ and $R_{B2}$ are then selected such that the current J corresponding to the desired switching voltage passes through the bias resistance $R_{B1}$ to produce the appropriate voltage drop (e.g., $V_{DD}$ less the desired switching voltage). Thus, in the exemplary configuration shown, the bias resistor $R_{B1}$ is selected such that the current J passing through it produces a voltage drop on the order of (VDD–5) volts. In other words, $R_{B1} \approx (V_{DD}-5)$ volts/$1\times10^{-3}$ A/cm$^2$. The value of the bias resistance $R_{B2}$ is chosen according to the desired voltage swing at the output terminals (e.g., the cathode terminal $V_{out+}$ and the anode terminal $V_{out-}$). More specifically, the bias resistance $R_{B2}$ dictates the ratio of the voltage at these output terminals. Because the device is inhibited from switching into the ON/conducting state, the output voltage swing will be limited to how high the current can rise vertically at the switch point as it moves around either side of the switch point (i.e., from some point just below switching to some point just above switching. Therefore, the bias resistances $R_{B1}$ and $R_{B2}$ should be chosen as small as possible without allowing switching. This also reduces the output impedance. As set forth above, the ratio of bias resistances $R_{B1}$ and $R_{B2}$ is the ratio of the voltage level at the output terminals (e.g., the cathode terminal $V_{out+}$ and the anode terminal $V_{out-}$). Typically, this ratio is at or near one (i.e., equal values) unless the design dictates asymmetry. The input impedance is high by virtue of the magnitude of the input currents. With the input current $J_{inN}$ on the order of $5\times10^{-5}$ A/cm$^2$, the input impedance of the n-channel injector terminal is extremely high for small devices (e.g., 1 $\mu$m by 20 $\mu$m). Similarly, with the input current $J_{outP}$ on the order of $2\times10^{-3}$ A/cm$^2$, the input impedance of the p-channel injector terminal is be somewhat lower than the n-channel injector terminal but still very high for such small devices.

Advantageously, the thyristor-based high gain amplifier circuit provides the essential characteristics of a typical operational amplifier including:

i) a very large open loop gain such that small non-zero values of ($V_{in+}-V_{in-}$) drives the output voltage $V_{out+}$ to saturation; in other words, if ($V_{in+}-V_{in-}$) is positive, the output voltage $V_{out+}$ will saturate at its positive saturation limit (e.g., at or near $V_{DD}$); if ($V_{in+}-V_{in-}$) is negative, the output voltage $V_{out+}$ will saturate at its negative saturation limit (e.g., at or near ground potential); and ii) the input impedance of the device is very high to minimize signal currents into or out of the $V_{in+}$ and $V_{in-}$ terminals and thus minimize the loading effect on the input signal sources. Thus, the thyristor-based operational amplifier is suitable for many different signal processing applications such as amplification, filtering, buffering, rectification, threshold detection, and digital switching. In these applications, the thyristor-based operational amplifier may be configured with negative feedback and/or positive feedback. Negative feedback is provided by coupling the $V_{out+}$ output terminal (e.g., the cathode terminal) to the $V_{in-}$ terminal (e.g., the n-channel injector terminal) of the device, while positive feedback is provided by coupling the $V_{out+}$ output terminal (e.g., the cathode terminal) to the $V_{in+}$ terminal (e.g., the p-channel injector terminal) of the device.

In addition, the anode terminal of the thyristor device can be used as the output terminal ($V_{out-}$) of the operational amplifier. In this configuration, the open loop gain of the device is negative whereby $V_{out-}=-A(V_{in+}-V_{in-})$, and A is very large. In this configuration, negative feedback is provided by coupling the $V_{out-}$ output terminal (e.g., the anode terminal) to the $V_{in+}$ terminal (e.g., the p-channel injector terminal) of the device, while positive feedback is provided by coupling the $V_{out-}$ output terminal (e.g., the anode terminal) to the $V_{in-}$ terminal (e.g., the n-channel injector terminal) of the device.

The thyristor-based operational amplifier/high gain amplifier circuit as described above with respect to FIGS. 3A1 through 3A4 is configured for single-ended output. It can also be configured for differential output as shown in FIG. 3A5. In the differential output configuration, the cathode terminal electrode of the device provides the $V_{out+}$ signal, and the anode terminal electrode of the device provides the $V_{out-}$ signal to produce a differential output signal $(V_{out+}-V_{out-}) \approx 2A(V_{in+}-V_{in-})$, where A is very large. This configuration is also suitable for many different signal processing applications. In these applications, the thyristor-based operational amplifier/high gain amplifier circuit may be configured with negative feedback and/or positive feedback. Negative feedback is provided by coupling the $V_{out+}$ terminal (e.g., the cathode terminal) to the $V_{in-}$ terminal (e.g., the n-channel injector terminal) of the device, or by coupling the $V_{in-}$ terminal (e.g., the anode terminal) to the $V_{in+}$ terminal (e.g., the p-channel injector terminal) of the device. Positive feedback is provided by coupling the $V_{out+}$ terminal (e.g., the cathode terminal) to the $V_{in+}$ terminal (e.g., the p-channel injector terminal) of the device, or by coupling the $V_{out-}$ terminal (e.g., the anode terminal) to the $V_{in-}$ terminal (e.g., the n-channel injector terminal) of the device.

It will be appreciated by those skilled in the art that the output impedance of the thyristor device may be high, which could make the configurations described above unsuitable for applications that require a large output current from the operational amplifier. In these applications, an output buffer stage may be coupled between the output node(s) of the thyristor device (e.g., the cathode terminal and/or the anode terminal) and the output terminal(s) of the operational amplifier circuit (the $V_{out+}$ terminal and/or the $V_{out-}$ terminal of the circuit, which is coupled to the load impedance) as shown in FIGS. 3A6 and 3A7. The output buffer stage minimizes the output impedance of the operational amplifier circuit so that the voltage gain is relatively unaffected by the value of the load impedance. The output buffer stage may be realized by any one of a variety of well-known types of output buffer stages, including an emitter follower output stage, source-follower output stage or push-pull output stage. The emitter follower output stage utilizes a bipolar-type transistor configured as an emitter-follower to drive the load impedance. The source-follower output stage utilizes an FET-type transistor configured as a source-follower to drive the load impedance. The push-pull output stage utilizes complementary transistors (which may be bipolar-type transistors or FET-type transistors) that are configured as followers to drive the load impedance. Preferably, the transistor that realize the output buffer stage are quantum-well-base transistors (e.g., n-channel quantum well-base bipolar transistors and/or p-channel quantum well-base bipolar transistors) and/or n-type HFET transistors and/or p-type HFET transistors that are integrally formed with the thyristor device that provides the high gain amplification.

The thyristor-based amplifier circuits described herein may be used as a building block in many different signal processing application. An example is shown in FIG. 4A1 wherein the thyristor-based operational amplifier circuit is configured as an inverting amplifier circuit. In this configuration, a first resistor R1 is coupled between a source $V_s$ and the $V_{in-}$ input node (e.g., n-channel injector terminal) of the thyristor-based operational amplifier circuit. The $V_{in+}$ input node (e.g., p-channel injector terminal) is coupled to ground potential. A second resistor R2 is coupled in a negative feedback path between the $V_o$ output node (e.g., cathode terminal electrode) and the $V_{in-}$ input node. The resistors R1 and R2 are used to configure the heterojunction thyristor-based operational amplifier circuit as a inverting amplifier stage whereby the output signal produced at the output node $V_o$ is proportional to the signal supplied from the source $V_s$ by a gain factor $(-R2/R1)$. Such operation can be represented by the following equation:

$$v_o = -\frac{R2}{R1} v_s$$

where $v_s$ is the input signal supplied from the source $V_s$, and $v_o$ is the output signal produced at the output node (e.g., cathode terminal electrode) of the thyristor-based operational amplifier circuit. The equivalent circuit is shown in FIG. 4A2.

Another example is shown in FIG. 4B1 wherein the thyristor-based operational amplifier circuit is configured as an integrator. In this configuration, a resistor R is coupled between a source $V_s$ and the $V_{in-}$ input node (e.g., n-channel injector terminal) of the thyristor-based operational amplifier circuit. The $V_{in+}$ input node (e.g., p-channel injector terminal) is coupled to ground potential. A capacitor C is coupled in a negative feedback path between the $V_o$ output node (e.g., cathode terminal electrode) and the $V_{in-}$ input node. The resistor R and capacitor C are used to configure the heterojunction thyristor-based operational, amplifier circuit as an integration stage whereby the output signal produced at the output node $V_o$ is proportional to the integral of the signal supplied from the source $V_s$. Such operation can be represented by the following equation:

$$v_o(t) = \frac{-1}{(R*C)} \int v_s(t) dt$$

where $v_s$ is the input signal supplied from the source $V_s$, and $v_o$ is the output signal produced at the output node (e.g., cathode terminal electrode) of the thyristor-based operational amplifier circuit. The equivalent circuit is shown in FIG. 4B2.

The frequency response of the thyristor-based amplifier is dictated by the small signal response of the thyristor at the point of switching. The design of the structure is an important consideration here. For example, if the thyristor is constructed with sub-micron channel lengths, the frequency response is essentially that of the FET channel. Thus, if the input is to the n-channel injector terminal and the n-channel length is on the order of 0.1 $\mu$m, then the bandwidth of the n-channel (and the bandwidth of the device) is on the order of 150 GHz. Similarly, if the input is to the p-channel injector terminal and the p-channel length is on the order of 0.1 $\mu$m, then the bandwidth of the p-channel (and the bandwidth of the device) is on the order of 100 GHz. Thus, the thyristor-based amplifier circuit is suitable for very high frequency applications.

There have been described and illustrated herein a heterojunction thyristor-based high gain amplifier/operational amplifier circuit and methods of fabricating the heterojunction thyristor and associated circuit elements. While particular embodiments of the invention have been described, it is not intended that the invention be limited thereto, as it is intended that the invention be as broad in scope as the art will allow and that the specification be read likewise. Thus, while particular group III–V heterostructures have been disclosed, it will be appreciated that other heterostructures (such as strained silicon-germanium (SiGe) heterostructures) can be used to realize the heterojunction thyristor devices described herein, amplifier circuits that include such heterojunction thyristor devices, and monolithic integrated circuits that include such thyristor-based amplifier circuits. Moreover, while particular bias configurations have been shown, it will be appreciated that other bias configurations may be used to realize thyristor-based amplifier circuits as described herein. It will therefore be appreciated by those skilled in the art that yet other modifications could be made to the provided invention without deviating from its spirit and scope as claimed.

What is claimed is:

1. An integrated circuit comprising:
   a heterojunction thyristor device including an anode terminal, a cathode terminal, a first injector terminal operably coupled to a first quantum well channel disposed between said anode terminal and said cathode terminal, and a second injector terminal operably coupled to a second quantum well channel disposed between said anode terminal and said cathode terminal; and
   bias elements that operate said heterojunction thyristor device in a mode that provides substantially linear voltage gain over a range of electrical signals supplied to at least of said first and second injector terminals for output to at least one output node.

2. An integrated circuit according to claim 1, wherein:
   said at least one output node comprises said anode terminal.

3. An integrated circuit according to claim 1, wherein:
   said at least one output node comprises said cathode terminal.

4. An integrated circuit according to claim 1, wherein:
   open loop voltage gain provided by said heterojunction thyristor device is at least 200.

5. An integrated circuit according to claim 4, wherein:
   said open loop voltage gain is greater than 50,000.

6. An integrated circuit according to claim 1, wherein:
   said bias elements include at least one current source that supplies a DC current to at least one of said first and second injector terminals, said DC current controlling the amount of voltage gain provided by said heterojunction thyristor device.

7. An integrated circuit according to claim 6, wherein:
   said first quantum well channel comprises an n-type modulation doped quantum well structure and said second quantum well channel comprises a p-type modulation doped quantum well structure; and
   said bias elements include a first DC current source operably coupled to said n-type modulation doped quantum well structures and a second DC current source operably coupled to said p-type modulation doped quantum well structure.

8. An integrated circuit according to claim 7, wherein:
   said bias elements include a first bias resistor operably coupled between a high voltage supply and said anode terminal and a second bias resistor operably coupled between said cathode terminal and a low voltage supply.

9. An integrated circuit according to claim 1, wherein:
   said bias elements provide a current passing from said anode terminal to said cathode terminal that is below a characteristic hold current for said heterojunction thyristor device to thereby inhibit switching of said heterojunction thyristor device.

10. An integrated circuit according to claim 1, further comprising:
    a first coupling capacitor operably coupled to said first injector terminal, and a second coupling capacitor operably coupled to said second injector terminal.

11. An integrated circuit according to claim 1, wherein:
    a differential input signal is supplied to said first and second injector terminals.

12. An integrated circuit according to claim 11, wherein:
    said at least one output node comprises said cathode terminal which produces a single-ended output signal that represents said differential input signal amplified by a large inverted characteristic voltage gain.

13. An integrated circuit according to claim 11, wherein:
    said at least one output node comprises said anode terminal which produces a single-ended output signal that represents said differential input signal amplified by a large non-inverted characteristic voltage gain.

14. An integrated circuit according to claim 11, wherein:
    said at least one output node comprises said cathode terminal and said anode terminal which together produce a differential output signal that represents said differential input signal amplified by a large characteristic voltage gain.

15. An integrated circuit according to claim 1, further comprising:
    an output buffer stage coupled to at least one of said anode terminal and said cathode terminal of said heterojunction thyristor device.

16. An integrated circuit according to claim 1, wherein:
    said heterojunction thyristor device is formed from a multilayer structure of group III–V materials.

17. An integrated circuit according to claim 1, wherein:
    said heterojunction thyristor device is formed from a multilayer structure of strained silicon materials.

18. An integrated circuit according to claim 1, wherein:
    said heterojunction thyristor device further comprises a p-channel FET transistor formed on said substrate and an n-channel FET transistor formed atop said p-channel FET transistor.

19. An integrated circuit according to claim 18, wherein:
    said p-channel FET transistor comprises a modulation doped p-type quantum well structure, and wherein said n-channel FET transistor comprises a modulation doped n-type quantum well structure.

20. An integrated circuit according to claim 19, wherein:
    said p-channel FET transistor includes a bottom active layer,
    said n-channel FET transistor includes a top active layer, and
    said heterojunction thyristor device further comprises an anode terminal operably coupled to said top active layer, a cathode terminal operably coupled to said bottom active layer, and an injector terminal operably coupled to at least one of said modulation doped n-type quantum well structure and said modulation doped p-type quantum well structure.

21. An integrated circuit according to claim 20, wherein:
    said heterojunction thyristor device further comprises an ohmic contact layer, a metal layer for said anode terminal that is formed on said ohmic contact layer, and a plurality of p-type layers formed between said ohmic contact layer and said n-type modulation doped quantum well structure.

22. An integrated circuit according to claim 21, wherein:
said plurality of p-type layers are separated from said n-type modulation doped quantum well structure by undoped spacer material.

23. An integrated circuit according to claim 21, wherein:
said plurality of p-type layers include a top sheet and bottom sheet of planar doping of highly doped p-material separated by a lightly doped layer of p-material, whereby said top sheet achieves low gate contact resistance and said bottom sheet defines the capacitance of said n-channel FET transistor.

* * * * *